(12) United States Patent
Kudrle et al.

(10) Patent No.: US 6,912,078 B2
(45) Date of Patent: Jun. 28, 2005

(54) ELECTROSTATICALLY ACTUATED MICRO-ELECTRO-MECHANICAL DEVICES AND METHOD OF MANUFACTURE

(75) Inventors: Thomas David Kudrle, Cambridge, MA (US); Carlos Horacio Mastrangelo, Andover, MA (US); Marc Waelti, East Hamstead, NH (US); ChuanChe Wang, Wilmington, MA (US); Gordon M. Shedd, Lawrenceville, PA (US); Gregory A. Kirkos, Somerville, MA (US); Mirela Gabriela Bancu, Somerville, MA (US); James Ching-Ming Hsiao, Somerville, MA (US)

(73) Assignee: Corning Incorporated, Corning, NY (US)

( * ) Notice: Subject to any disclaimer, the term of this patent is extended or adjusted under 35 U.S.C. 154(b) by 128 days.

(21) Appl. No.: 10/098,830

(22) Filed: Mar. 15, 2002

(65) Prior Publication Data

US 2002/0146200 A1 Oct. 10, 2002

Related U.S. Application Data

(60) Provisional application No. 60/276,814, filed on Mar. 16, 2001.

(51) Int. Cl.[7] ......................... G02B 26/08; G02B 26/00; G02B 7/182; G01C 19/04
(52) U.S. Cl. ....................... 359/224; 359/290; 359/874; 73/504.09
(58) Field of Search ......................... 359/198, 223–225, 359/290, 291, 295, 298, 872, 874, 876; 73/504.09; 385/18, 19; 310/36, 309

(56) References Cited

U.S. PATENT DOCUMENTS

| | | | |
|---|---|---|---|
| 5,126,812 A | 6/1992 | Greiff | 357/25 |
| 5,216,490 A | 6/1993 | Greiff et al. | 73/517 |
| 5,392,151 A | 2/1995 | Nelson | 359/223 |
| 5,912,608 A | 6/1999 | Asada | 335/222 |
| 6,046,840 A | 4/2000 | Huibers | 359/291 |
| 6,283,601 B1 | 9/2001 | Hagelin et al. | 359/871 |
| 6,300,665 B1 | 10/2001 | Peeters et al. | 257/415 |
| 6,445,844 B1 * | 9/2002 | Neukermans et al. | 385/18 |
| 6,480,645 B1 | 11/2002 | Peale et al. | 385/18 |
| 6,819,822 B2 * | 11/2004 | Behin et al. | 385/18 |
| 2002/0071171 A1 * | 6/2002 | Greywall | 359/292 |
| 2002/0122238 A1 * | 9/2002 | Knipe | 359/291 |
| 2003/0090172 A1 * | 5/2003 | Lee et al. | 310/309 |

* cited by examiner

Primary Examiner—Georgia Epps
Assistant Examiner—William Choi
(74) Attorney, Agent, or Firm—Wilmer, Cutler, Pickering, Hale and Dorr

(57) ABSTRACT

One embodiment is directed to a gimbal mechanism for a MEMS mirror device having folded flexure hinges. Another embodiment is directed to a gimbal mechanism having a frame with through-holes or recesses distributed thereabout to reduce weight of said frame. Other embodiments are directed to improved electrode structures for electrostatically actuated MEMS devices. Other embodiments are directed to methods for fabricating electrodes for electrostatically actuated MEMS devices. Other embodiments are directed to methods of fabricating through-wafer interconnect devices. Other embodiments are directed to MEMS mirror array packaging. Other embodiments are directed to electrostatically actuated MEMS devices having driver circuits integrated therewith. Other embodiments are directed to methods of patterning wafers with a plurality of through-holes. Other embodiments are directed to methods of forming moveable structures in MEMS devices. Other embodiments are directed to methods of depositing a thin film on the back of a MEMS device.

31 Claims, 43 Drawing Sheets

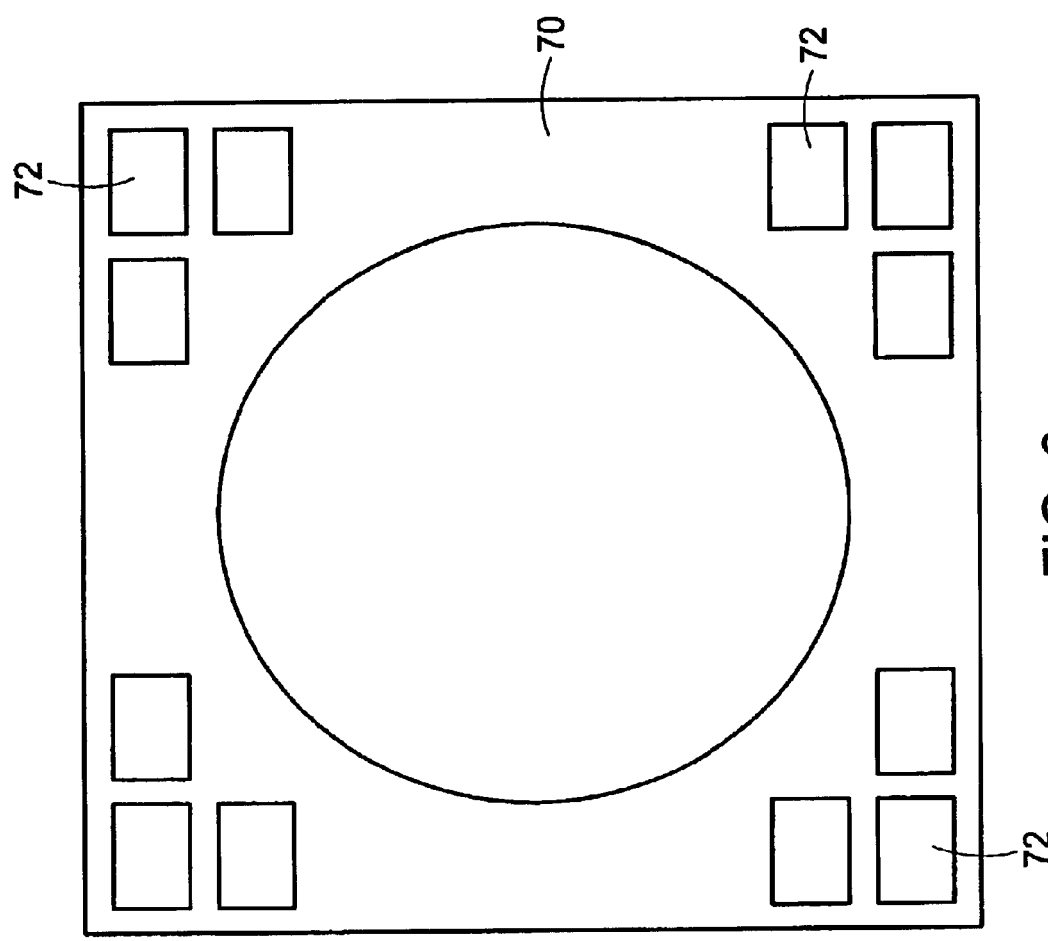

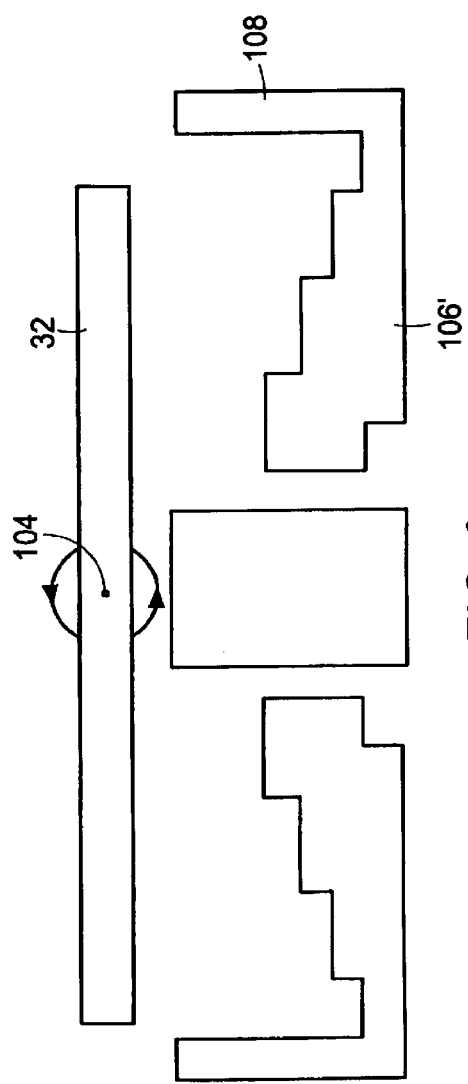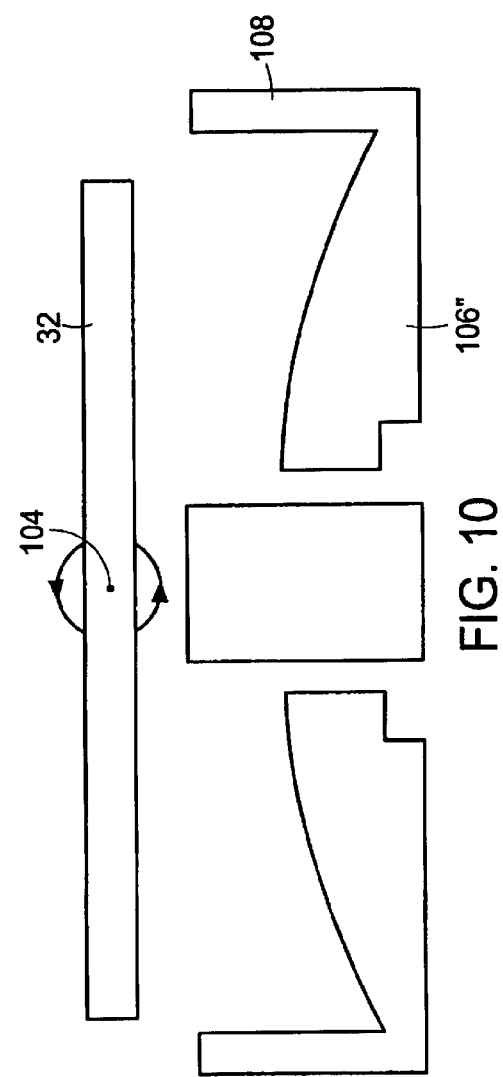

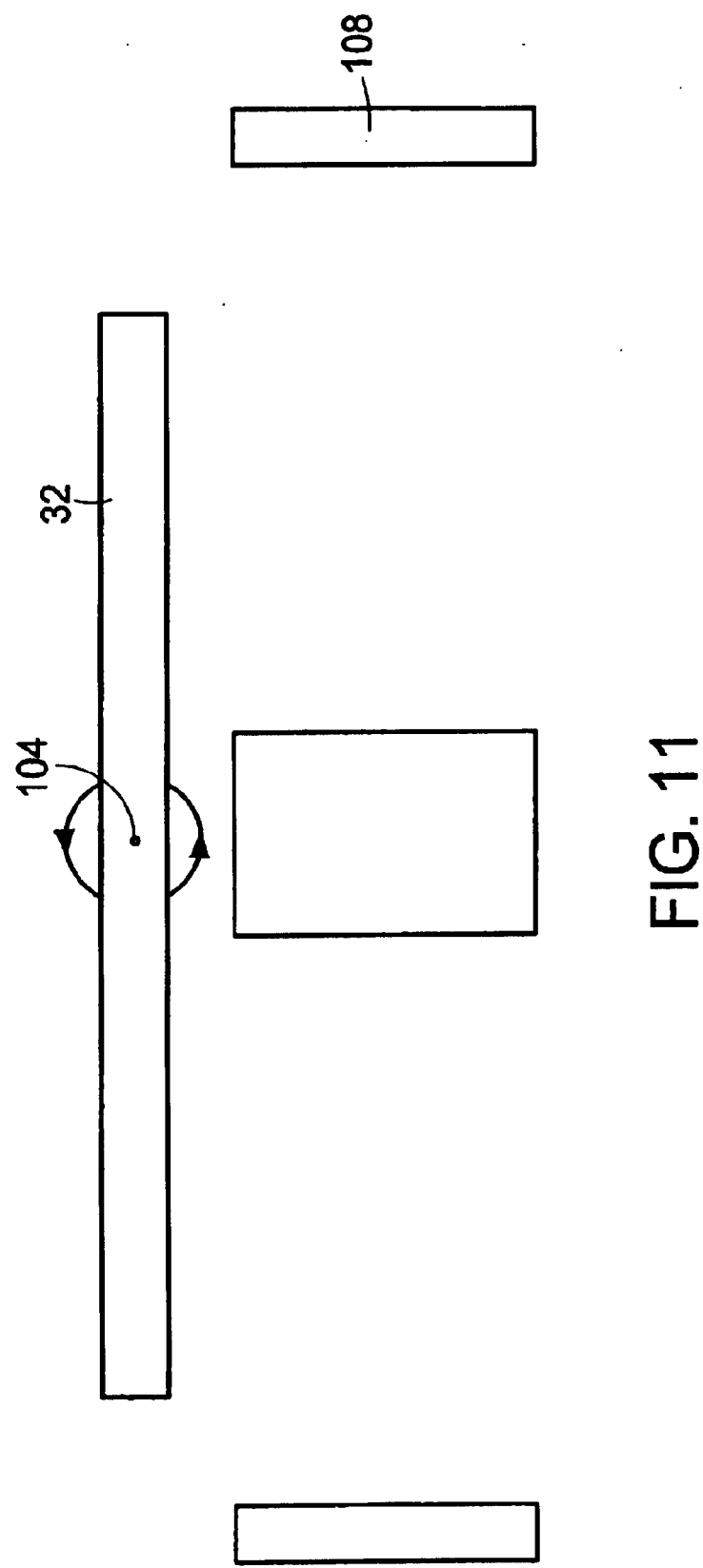

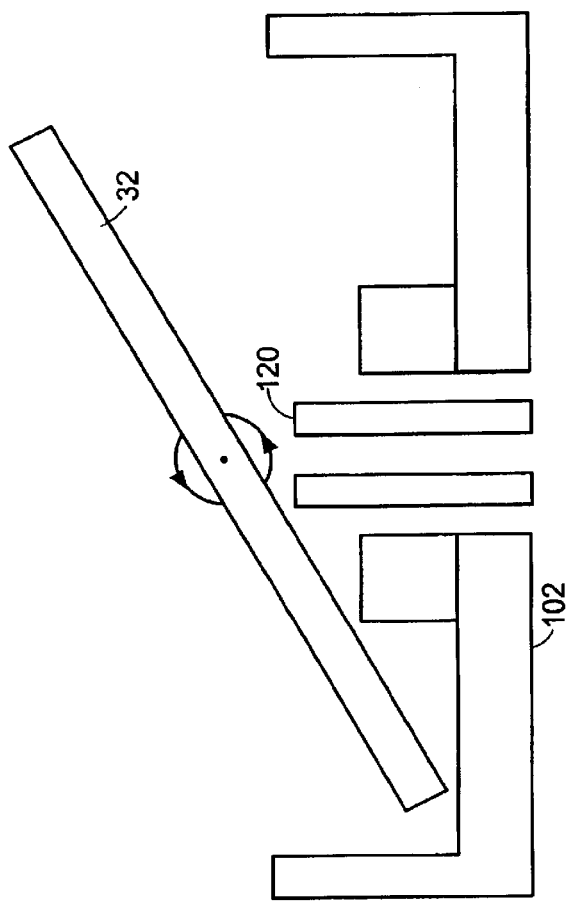
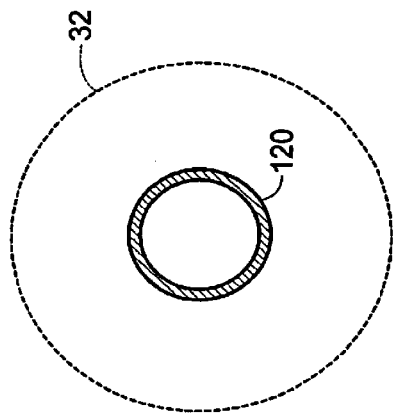
FIG. 12A
FIG. 12B

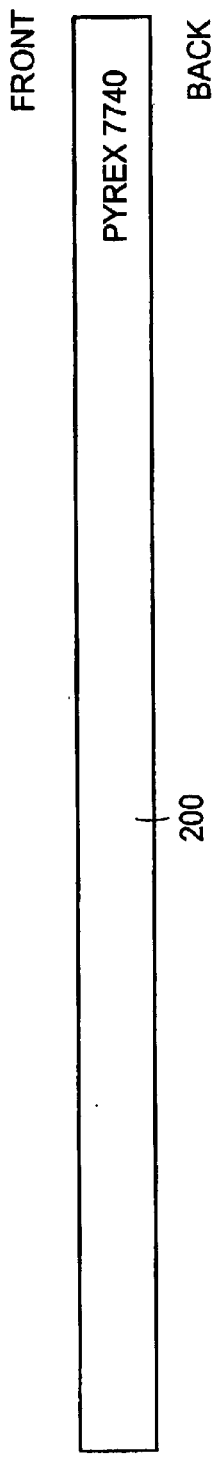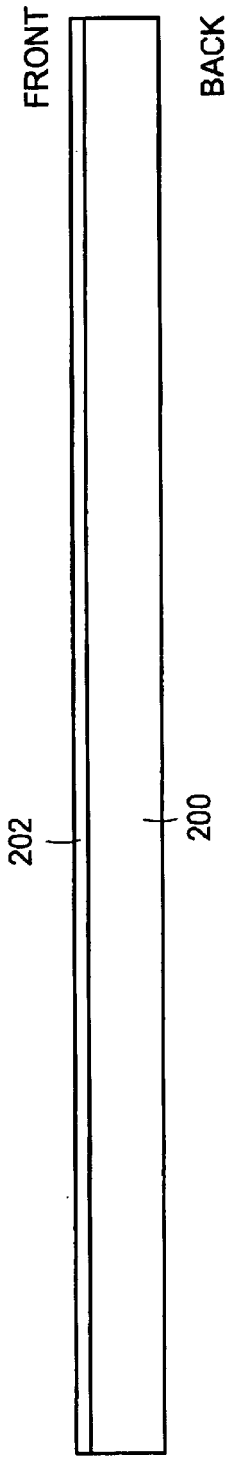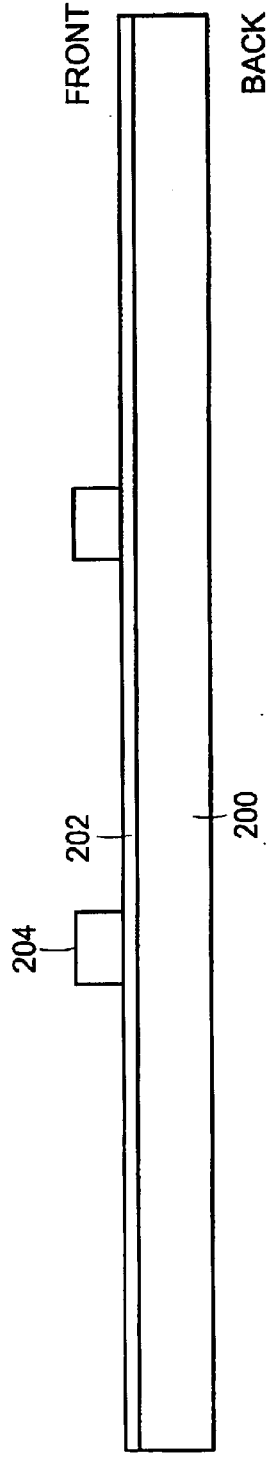

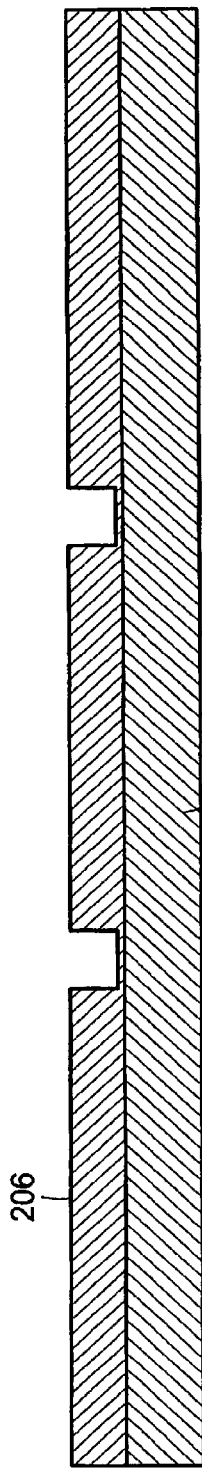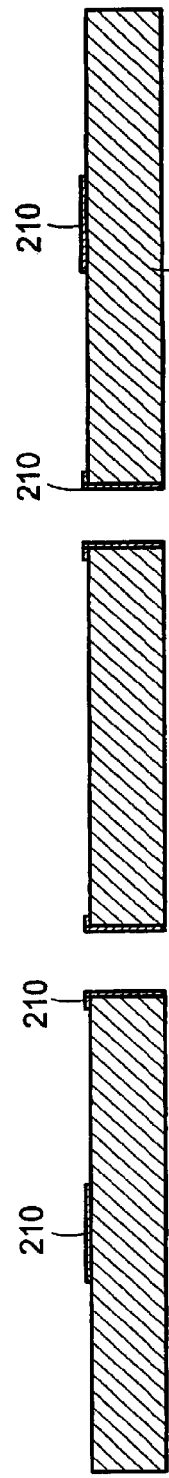

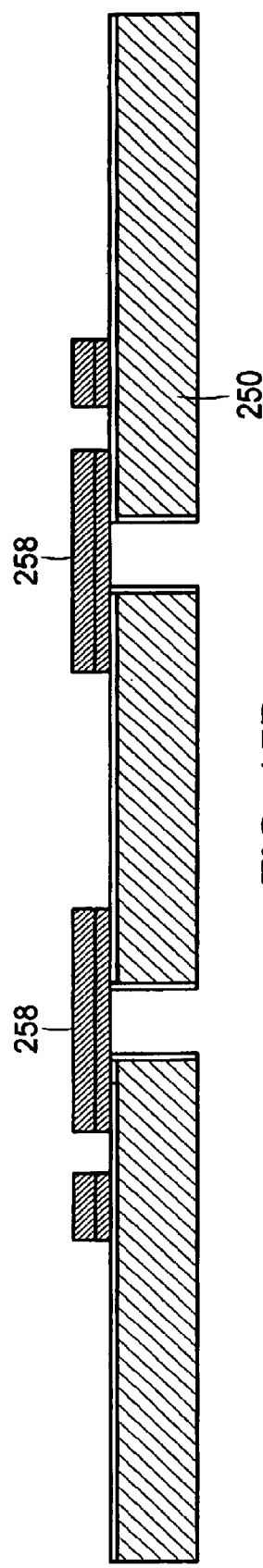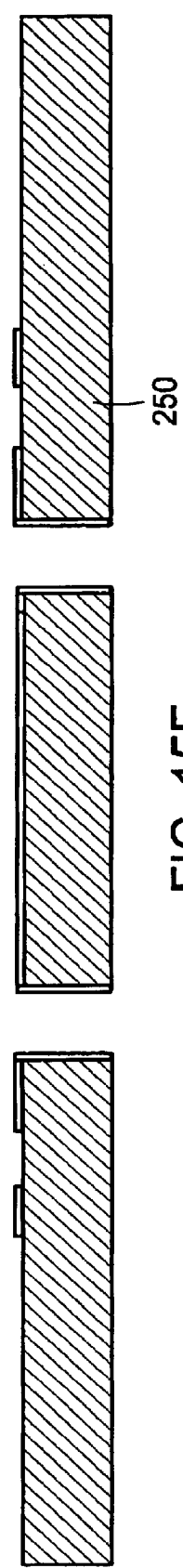

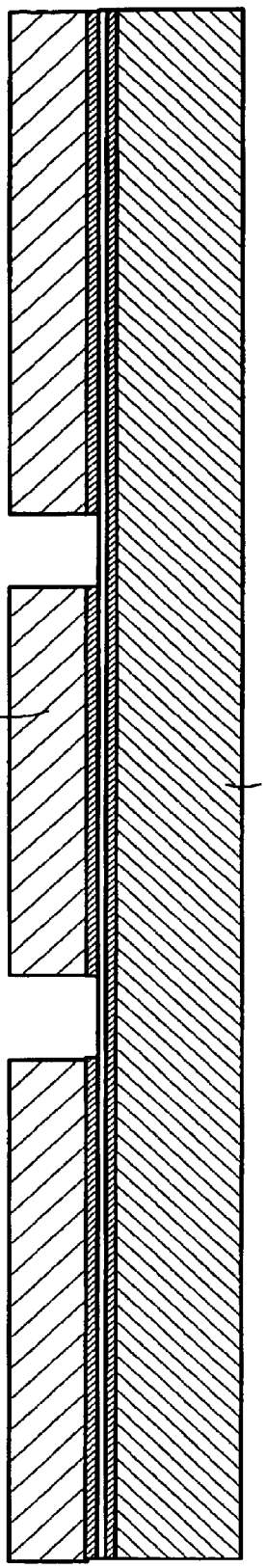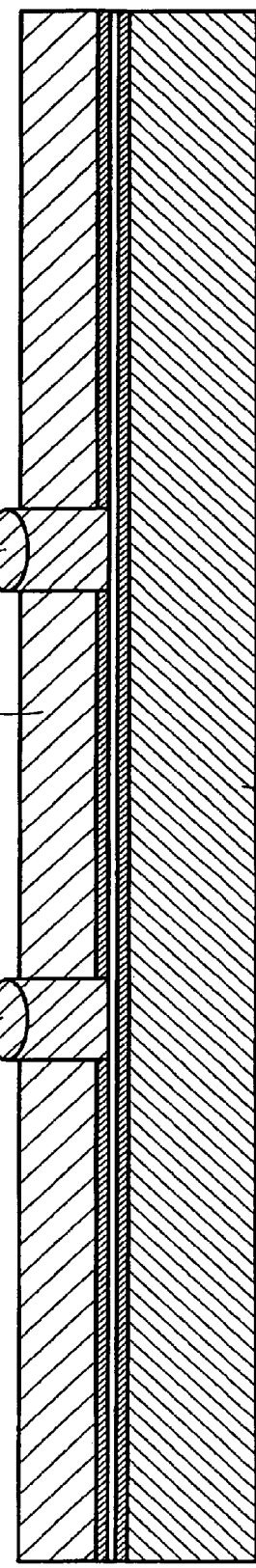

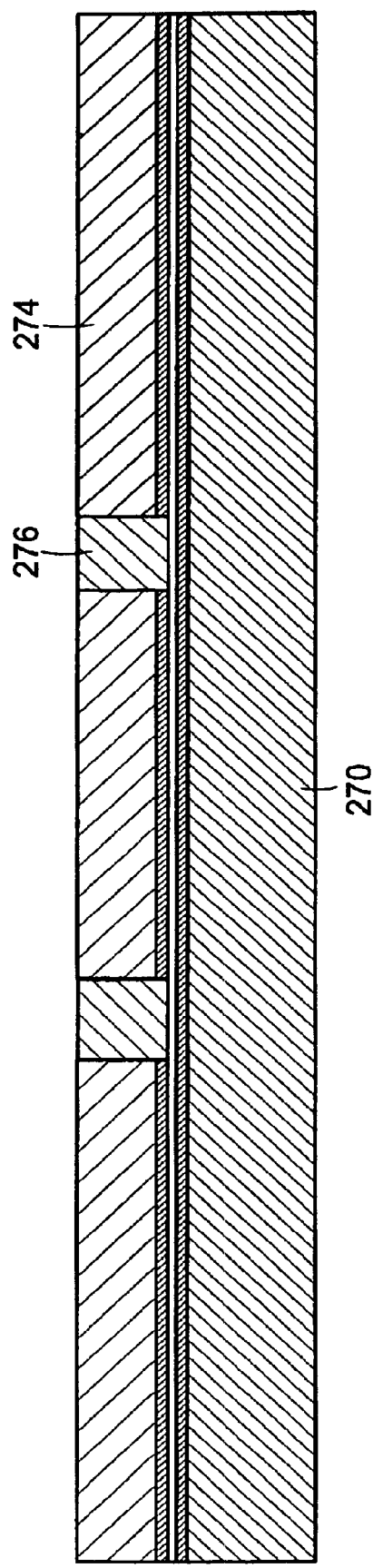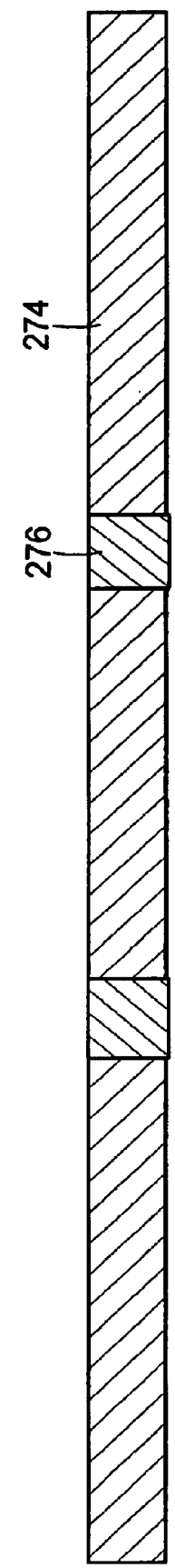
FIG. 16E
FIG. 16F

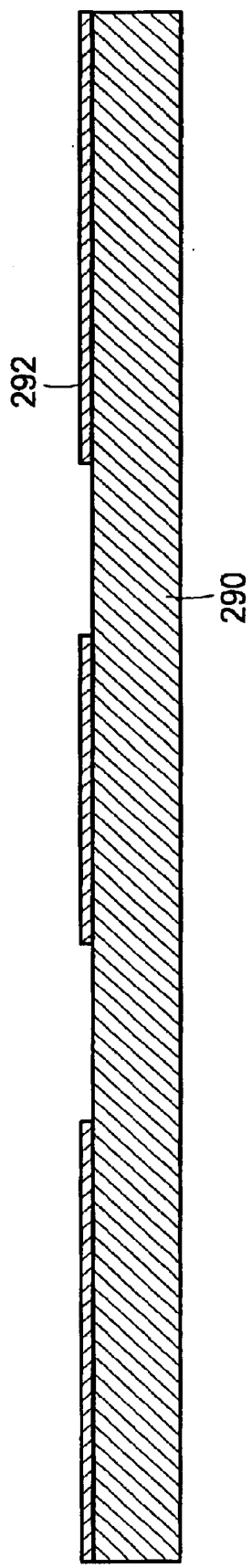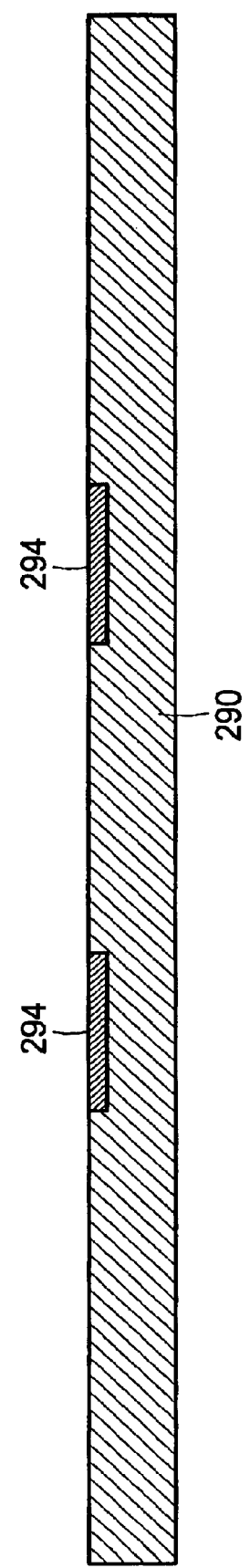

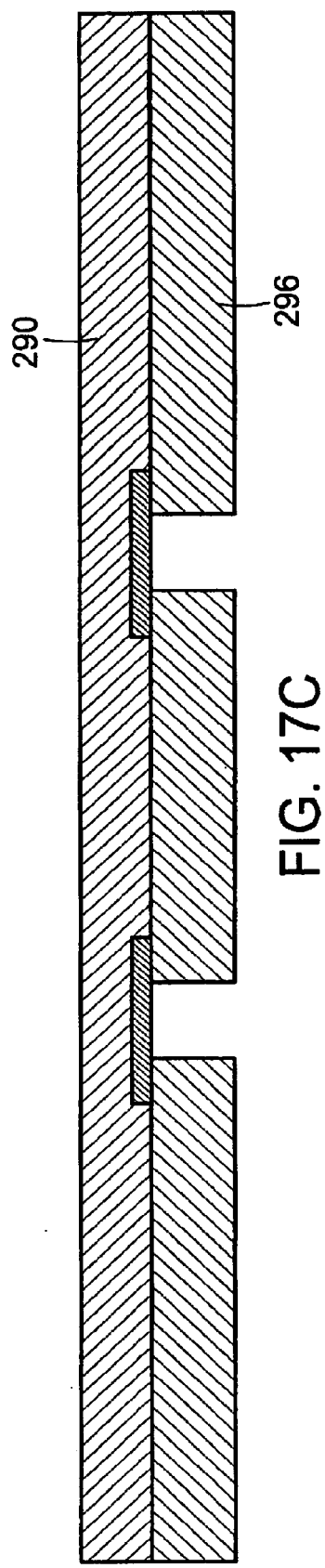
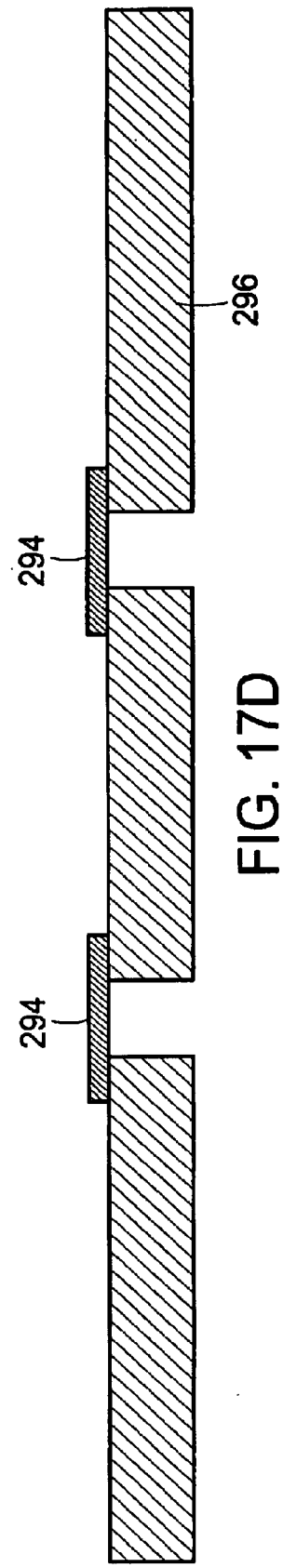

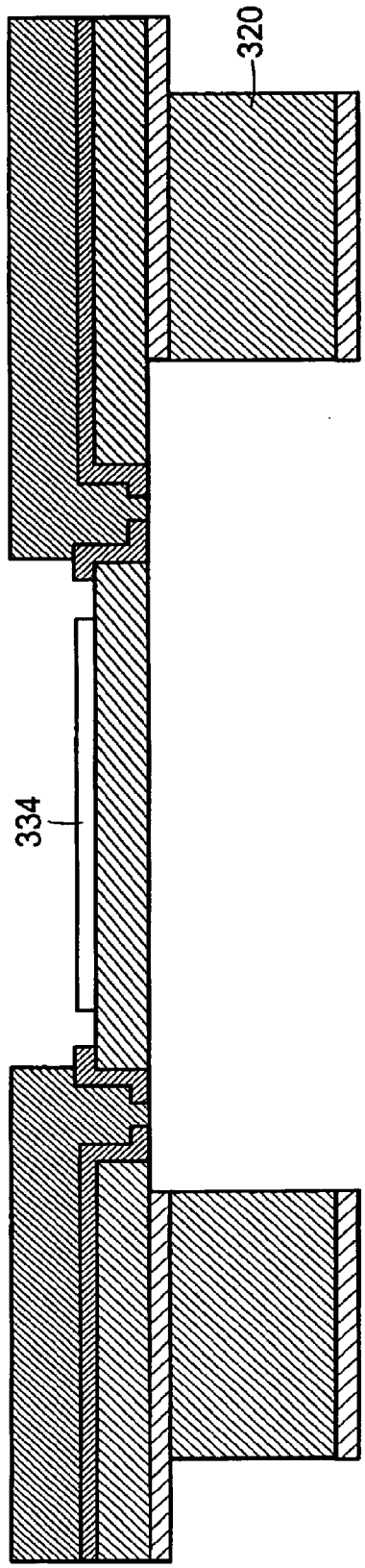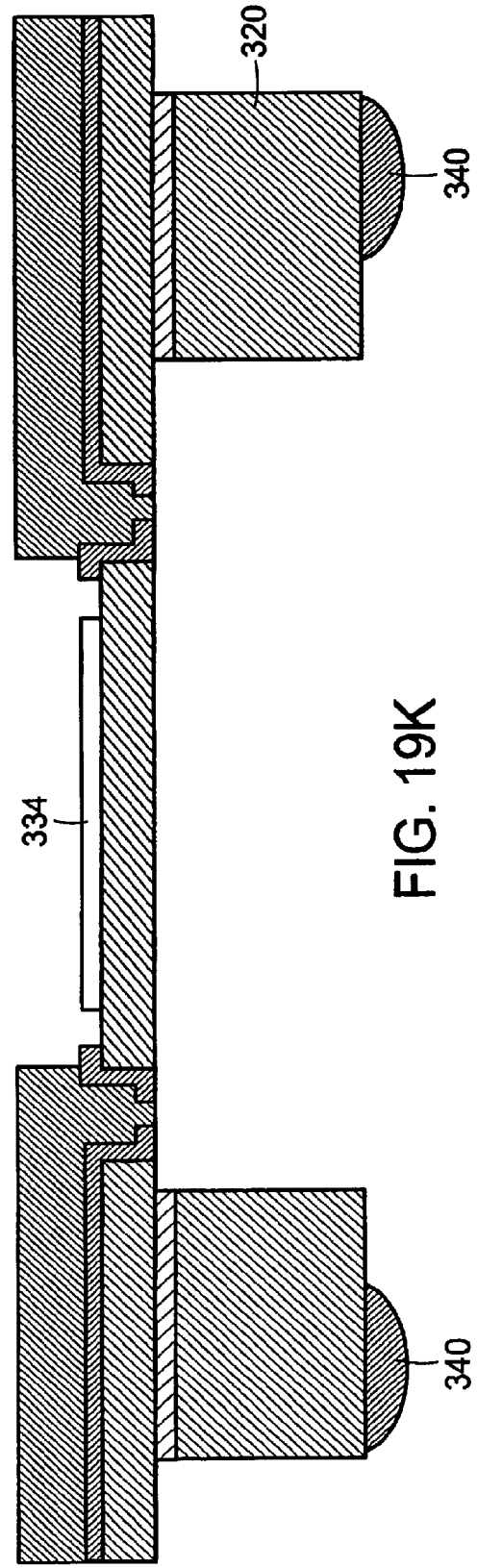

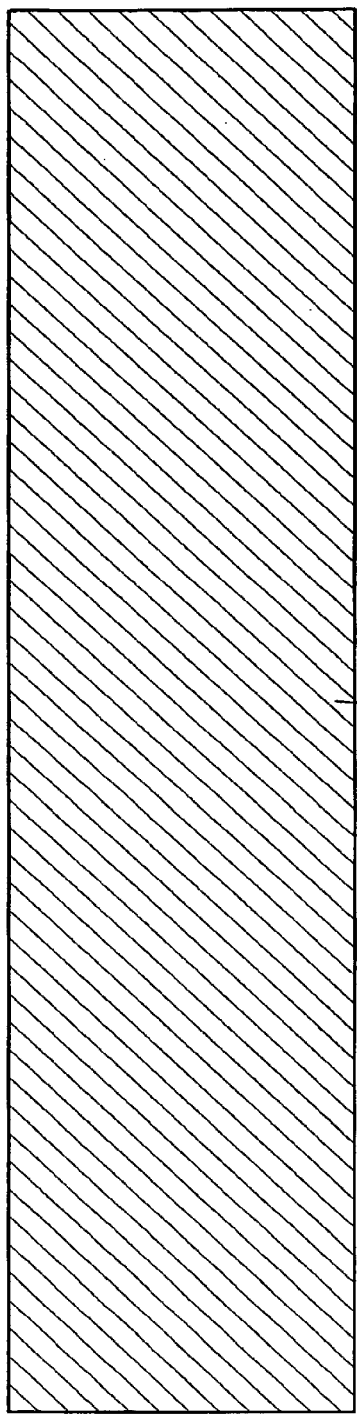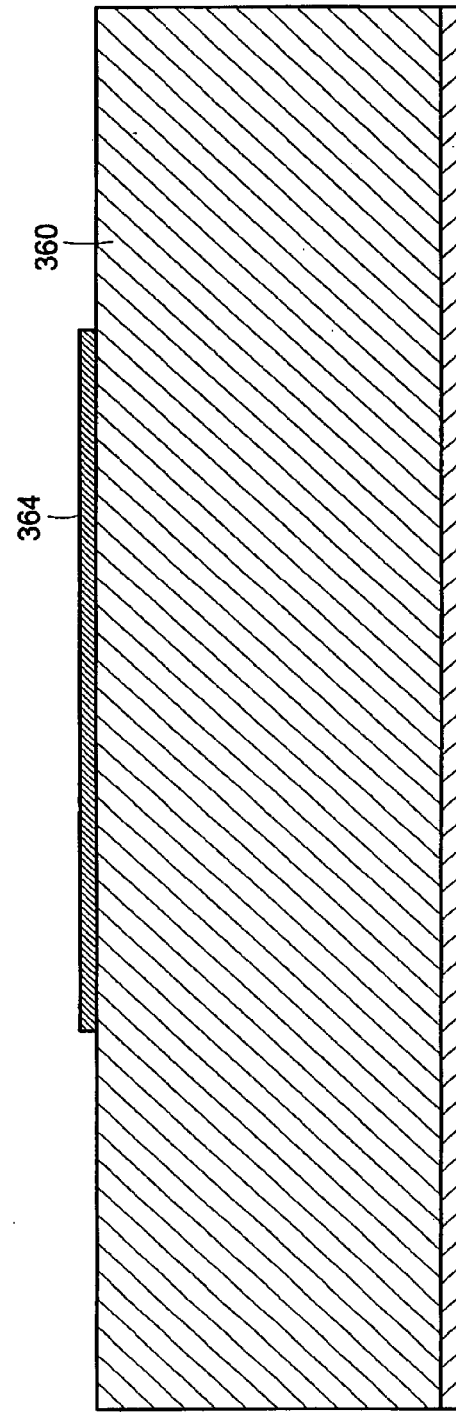

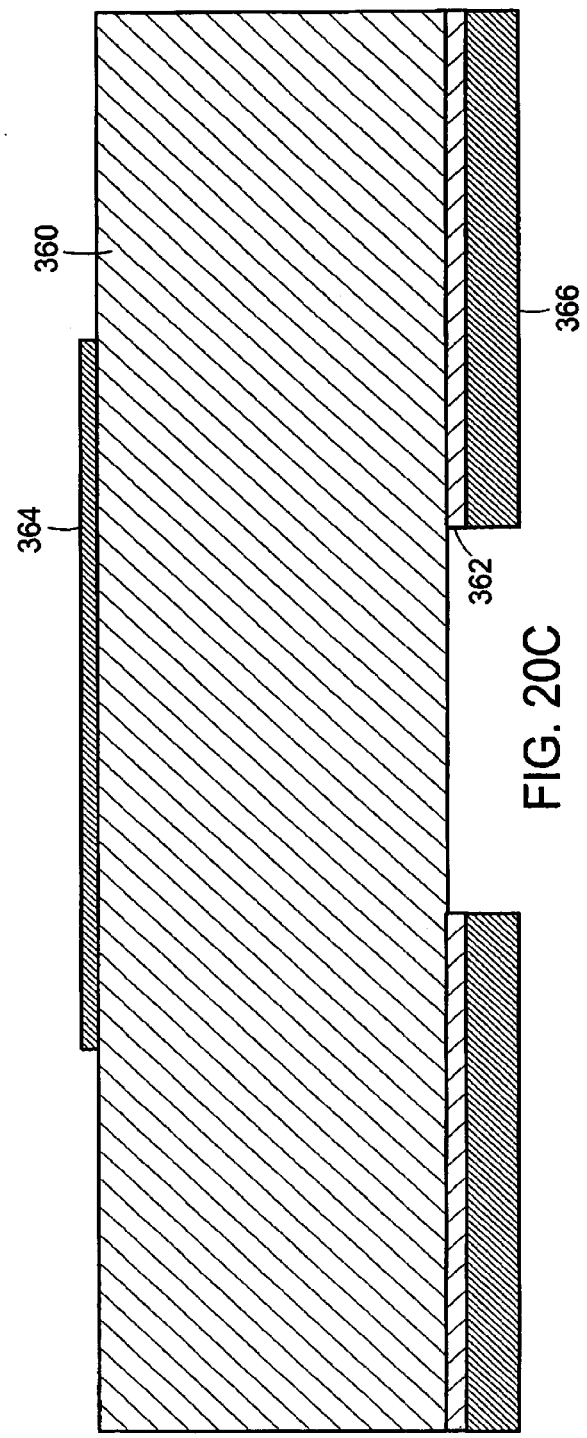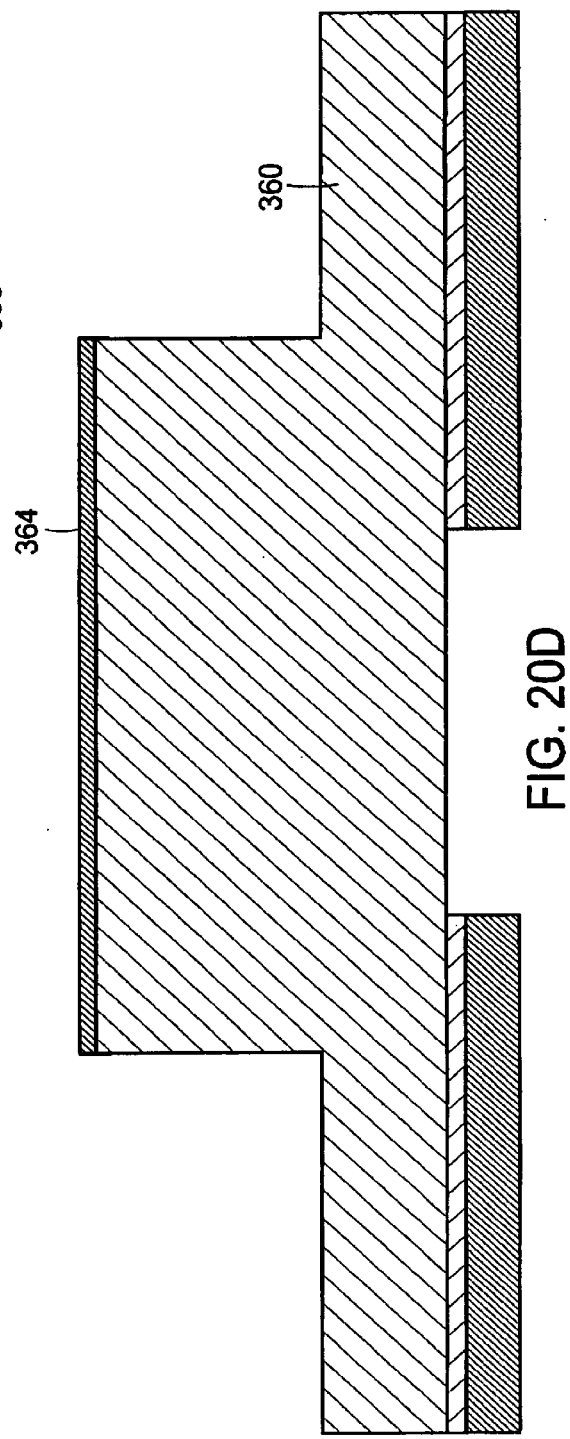

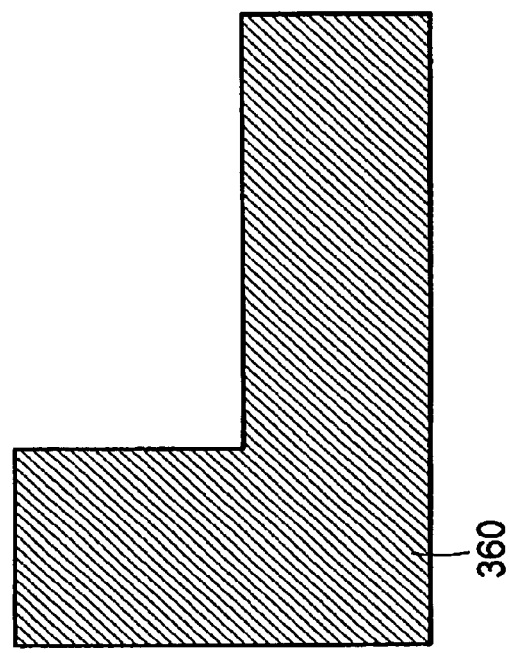
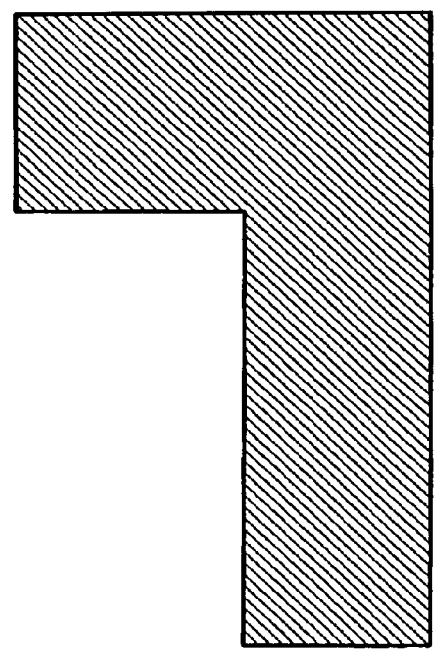
FIG. 20E

US 6,912,078 B2

ELECTROSTATICALLY ACTUATED MICRO-ELECTRO-MECHANICAL DEVICES AND METHOD OF MANUFACTURE

RELATED APPLICATION

The present application is based on and claims priority from U.S. Provisional Patent Application Ser. No. 60/276,814 filed on Mar. 16, 2001 and entitled Electrostatically Actuated Micro-Electro-Mechanical Device and Method of Manufacture.

BACKGROUND OF THE INVENTION

1. Field of the Invention

The present invention relates generally to micro-electro-mechanical (MEMS) devices and, in particular, to arrayed electrostatically actuated MEMS devices such as, e.g., arrayed mirrors used in optical switches.

2. Description of Related Art

One example of the use of arrayed electrostatically actuated MEMS devices is in an optical switch. FIG. 1 schematically illustrates an example of an optical cross-connect 12 of an optical switch. The cross-connect 12 includes an array of collimators or other beam-forming devices (represented by grid 14), which forms incoming optical communications signals into beams that impinge on an array of moveable reflectors or mirrors represented by grid 16. Each beam from grid 14 has its own corresponding moveable mirror on grid 16.

The moveable mirrors of grid 16 are controllably positioned so as to individually direct the respective beams from grid 14 to respective moveable mirrors of a second array of moveable mirrors, represented by grid 18. The moveable mirrors of grid 18 are positioned so as to individually direct the beams received from grid 16 to respective beam receivers of an array of beam receivers represented by grid 20. The beam receivers may take various forms, such as transducers, or optical elements for coupling the respective beams into respective waveguides, or the like. As with grids 14 and 16, each moveable mirror of grid 18 is associated with a particular beam receiver of grid 20, so that each receiver receives beams on a single axis. The arrow 20 shows a representative signal path from grid 14 to grid 20.

The movable mirrors can be steered or controllably tilted about one or more axes. Mirror movement can be actuated in a variety of ways including through electromagnetic actuation, electrostatic actuation, piezoelectric actuation, stepper motors, thermal bimorph and comb-drive actuation.

In electrostatically actuated mirror arrays, each mirror in the array is movably mounted on a base structure having a set of steering electrodes. The steering electrodes can be selectively actuated to generate electrostatic forces to tilt the mirror to a desired position.

Attempts have been made to fabricate arrays of movable mirror using MEMS technology, in which silicon processing and related techniques common to the semiconductor industry are used to form micro-electro-mechanical devices.

BRIEF SUMMARY OF THE INVENTION

The present invention is directed to improved electrostatically actuated MEMS devices and methods of manufacturing such devices. The various embodiments of the invention include the following.

One embodiment of the invention is directed to a gimbal mechanism for a MEMS mirror device having folded flexure hinges. Another embodiment of the invention is directed to a gimbal mechanism having a frame with through-holes or recesses distributed thereabout to reduce weight of said frame. Other embodiments of the invention are directed to improved electrode structures for electrostatically actuated MEMS devices. Other embodiments of the invention are directed to methods for fabricating electrodes for electrostatically actuated MEMS devices. Other embodiments of the invention are directed to methods of fabricating through-wafer interconnect devices. Other embodiments of the invention are directed to MEMS mirror array packaging. Other embodiments of the invention are directed to electrostatically actuated MEMS devices having driver circuits integrated therewith. Other embodiments of the invention are directed to methods of patterning wafers with a plurality of through-holes. Other embodiments of the invention are directed to methods of forming moveable structures in MEMS devices. Other embodiments of the invention are directed to methods of depositing a thin film on the back of a MEMS device.

These and other features of the present invention will become readily apparent from the following detailed description wherein embodiments of the invention are shown and described by way of illustration of the best mode of the invention. As will be realized, the invention is capable of other and different embodiments and its several details may be capable of modifications in various respects, all without departing from the invention. Accordingly, the drawings and description are to be regarded as illustrative in nature and not in a restrictive or limiting sense with the scope of the application being indicated in the claims.

BRIEF DESCRIPTION OF THE DRAWINGS

For a fuller understanding of the nature and objects of the present invention, reference should be made to the following detailed description taken in connection with the accompanying drawings wherein:

FIG. 6 is a schematic plan view of an inner gimbal frame in accordance with another embodiment of the invention;

FIGS. 9–11 are schematic cross-sectional views of electrode structures in accordance with further embodiments of the invention;

FIGS. 12A and 12B are cross-sectional and plan views, respectively illustrating a bump-stop in accordance with another embodiment of the invention;

FIGS. 13A–13M are cross-sectional schematic views illustrating the fabrication of a glass wafer interconnect device and shaped electrodes in accordance with another embodiment of the invention;

FIGS. 15A–15E are cross-sectional schematic views illustrating the process for patterning a wafer with through holes using a "tenting" approach in accordance with one embodiment of the invention;

FIGS. 16A–16F are cross-sectional schematic views illustrating the process for patterning a wafer with through holes using through-wafer electroplating, lapping and polishing in accordance with another embodiment of the invention;

FIGS. 17A–17D are cross-sectional schematic views illustrating the process for creating silicon bridges using heavy boron doping of silicon to span through holes to enable conventional photolithographic processing in accordance with another embodiment of the invention;

FIGS. 19A–19M are cross-sectional schematic views illustrating the process for creating suspended mirror structures over separately processed electrode structures in accordance with another embodiment of the invention;

FIGS. 20A–20F are cross-sectional schematic views illustrating the process for creating a shadow mask for deposition of gold on the back of mirrors for stress compensation in accordance with another embodiment of the invention.

FIG. 23 is a cross-sectional schematic view of an angled window bonded to a MEMS array chip in accordance with another embodiment of the invention;

DETAILED DESCRIPTION OF PREFERRED EMBODIMENTS

The present invention is generally directed to improved electrostatically actuated MEMS devices and methods of manufacturing such devices. These MEMS devices can have a range of applications including, e.g., use in optical switches, relays, optical scanners, optical displays, laser writing systems, and laser printers.

Mirror Support Structure

Figure 2:
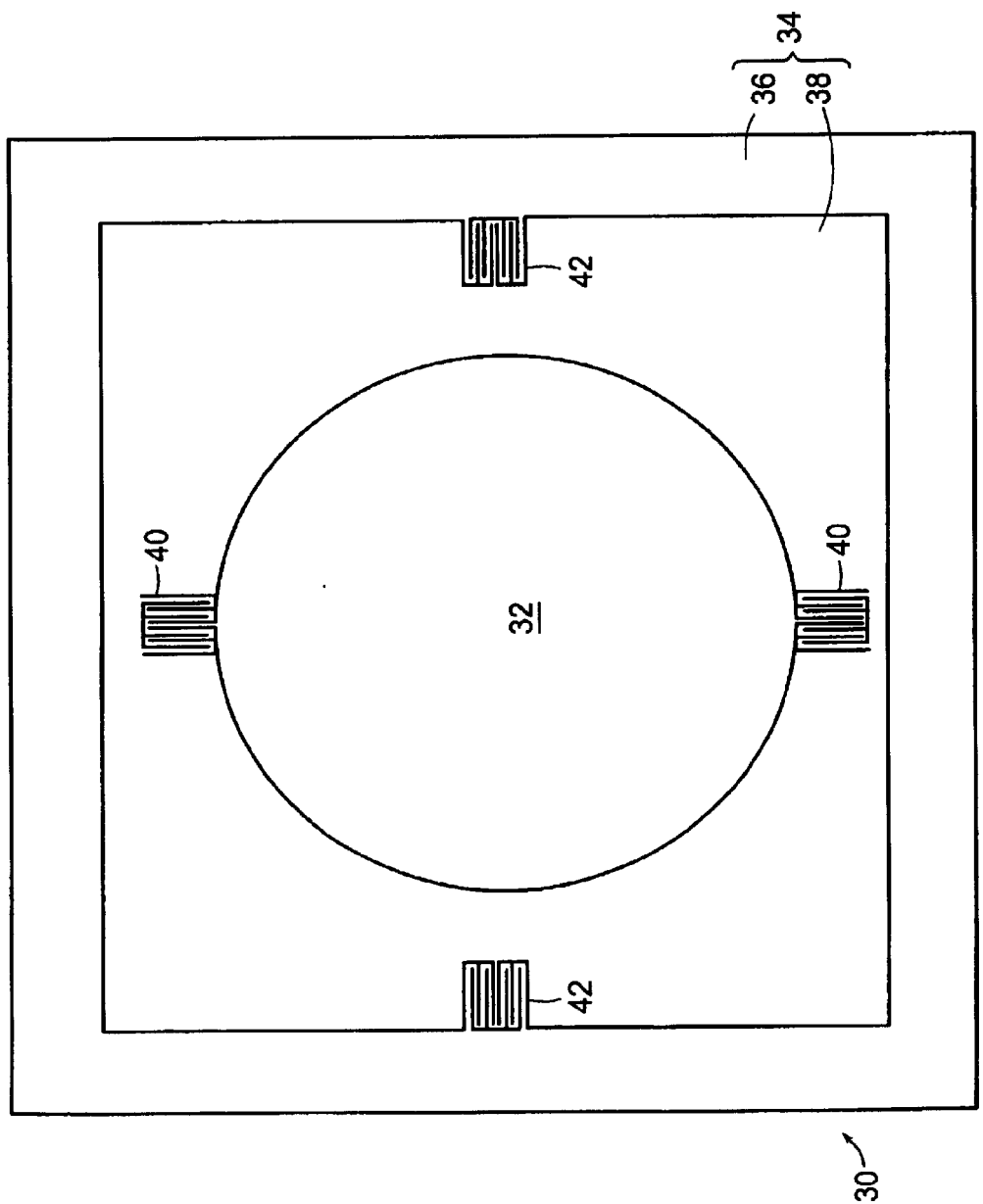
FIG. 2 is a plan view schematic diagram of a mirror pixel device in accordance with one embodiment of the invention.

A first embodiment of the invention is directed to an improved structure for movably supporting mirrors in a mirror array. FIG. 2 illustrates a single electrostatically actuated mirror device or pixel 30. The pixel 30 forms part of a mirrored array comprising a plurality of such pixels. The mirror device 30 includes a mirror 32 movably supported on a gimbal structure 34 in a "mirror-in-frame" configuration. The gimbal structure 34 includes an outer frame 36 and an inner frame 38. The outer frame is connected to the inner frame by a pair of opposed flexure hinges 42 defining a first axis of rotation for the mirror. The outer frame is fixed relative to a base structure on which the gimbal structure is supported. The inner frame 38 is connected to the mirror 32 by a second pair of opposed flexure hinges 40 defining a second axis of rotation, which is preferably perpendicular to the first axis. Electrodes (not shown in FIG. 2) positioned below the mirror-in-frame structure can be selectively actuated to generate electrostatic forces to cause attraction and tilting of the mirror 32 about the axes.

Figure 1:
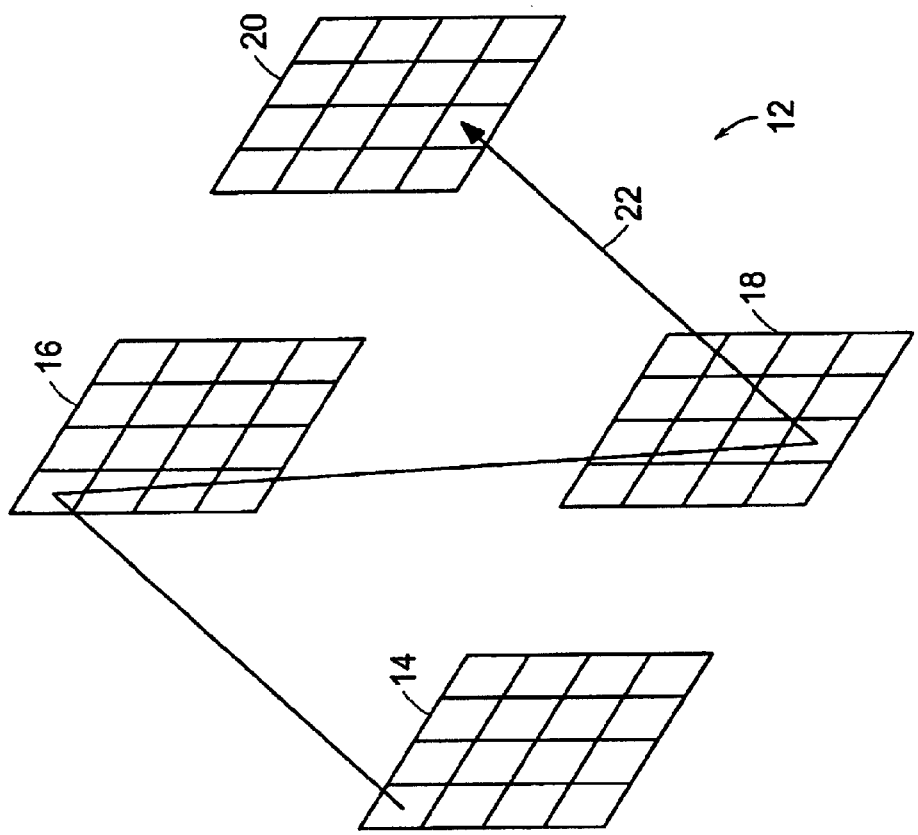
FIG. 1 is a schematic illustration of an example of an optical cross-connect.
Figure 3:
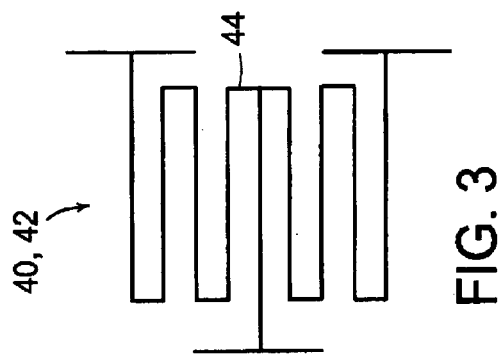
FIG. 3 is an enlarged plan view of a single spring of the mirror pixel device shown in FIG. 2.

A variety of different types of flexure hinges can be used in the gimbal structure. FIG. 3 is an enlarged view of one of the flexure hinges 40, 42 shown in FIG. 2. As shown, the flexure hinges 40, 42 have springs 44 with multiple folds, which allow the pitch of the mirrors to be lowered and their maximum deflection angle be increased. (Mirror pitch refers to the spacing between mirror centers of adjacent pixels in a mirror array.). The springs 44 increase torsional compliance of the hinges while reducing out-of-plane compliance. The springs 40, 42 also take up less space in their longest dimension (which is in a radial direction from the mirror center) than conventional straight springs and thereby help to reduce the overall pixel area. FIG. 3 shows an example of a spring with 7 folds. It should be realized, however, that other folded spring designs that have a greater or lesser number of folds and occupy different areas are also possible. The particular design used may be chosen based, e.g., on performance criteria, ease of fabrication, and other considerations.

The flexure hinges 42 are connected to the frame 38, which has most of its mass positioned further from the mirror center than the mirror, which is connected to flexure hinges 40. It is therefore often desirable to have the flexure hinges 42 be stiffer than the flexure hinges 40 in order to have better control of the part with greater moment of inertia. Furthermore, the frame 38 can often be arranged to have a larger torque to reach its maximum angle than the mirror and can therefore tolerate a stiffer spring. Therefore, if desired, the flexure hinges 42 can be different from the flexure hinges 40, with the torsional compliance of the hinges 42 being lower than that of the hinges 40. In some situations it may be desired to have the flexure hinges 42 have a higher torsional compliance than those of the flexure hinges 40.

Figure 4B:
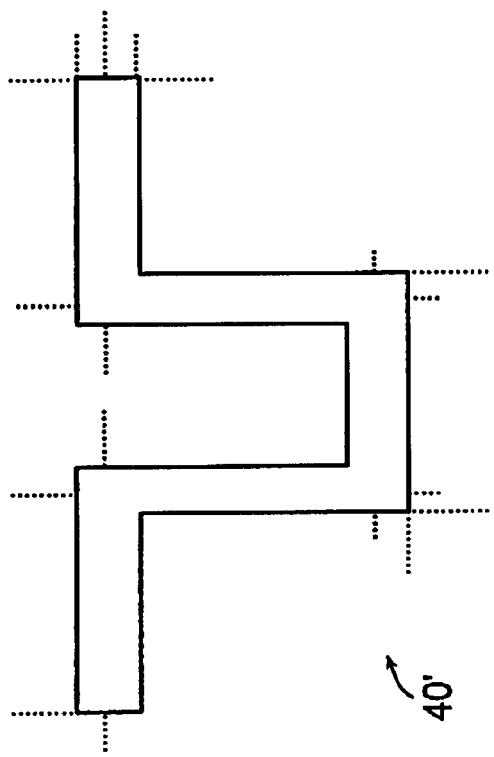
FIGS. 4A and 4B are schematic plan and cross-sectional views, respectively, of a flexure hinge in accordance with one embodiment of the invention.
Figure 4A:
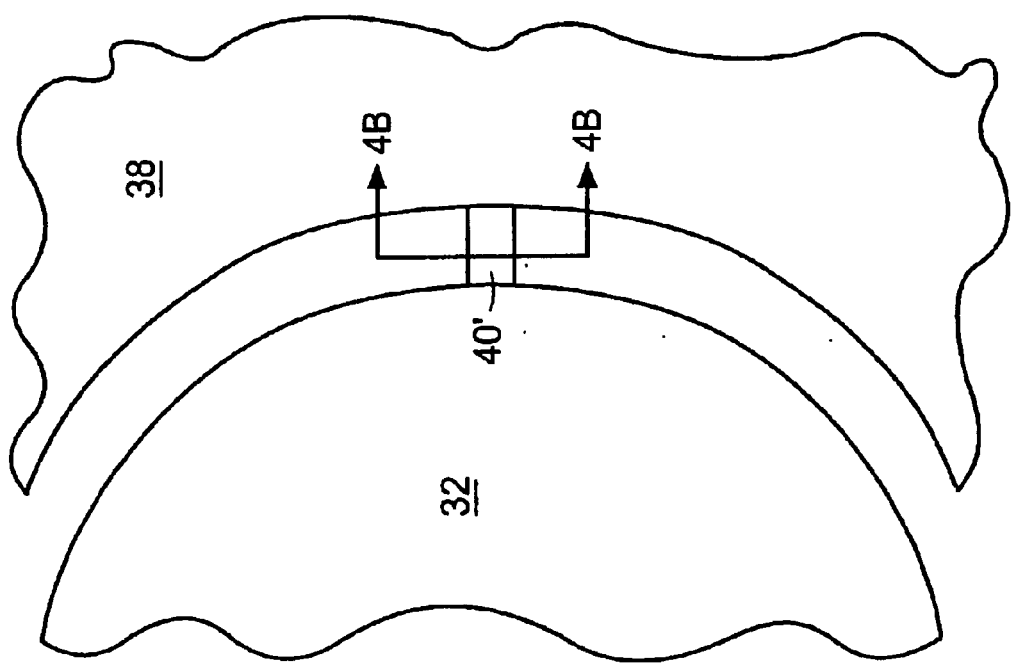

Other flexure hinge designs can also be used including, e.g., those with a non-uniform cross-sectional configuration. For example, an alternative flexure hinge having a folded cross-sectional configuration is shown in FIGS. 4A and 4B. FIG. 4A is a top view of the flexure hinge connecting the mirror 32 to the inner gimbal frame 38. FIG. 4B is a cross-sectional view of the flexure hinge taken along lines 4B-4B of FIG. 4A. The flexure hinge is a spring with a generally U-shaped configuration. Such a spring can provide a larger ratio of out-of-plane stiffness to torsional stiffness than is possible with a spring having a uniform cross-section. The cross-sectional and top view dimensions of the hinge can be varied to optimize various performance and space requirements.

Other flexure hinges with different cross-sectional shapes are also possible including, e.g., V-shaped springs. In addition, each flexure hinge can include multiple U or V or other cross-sectional members.

Figure 5A:
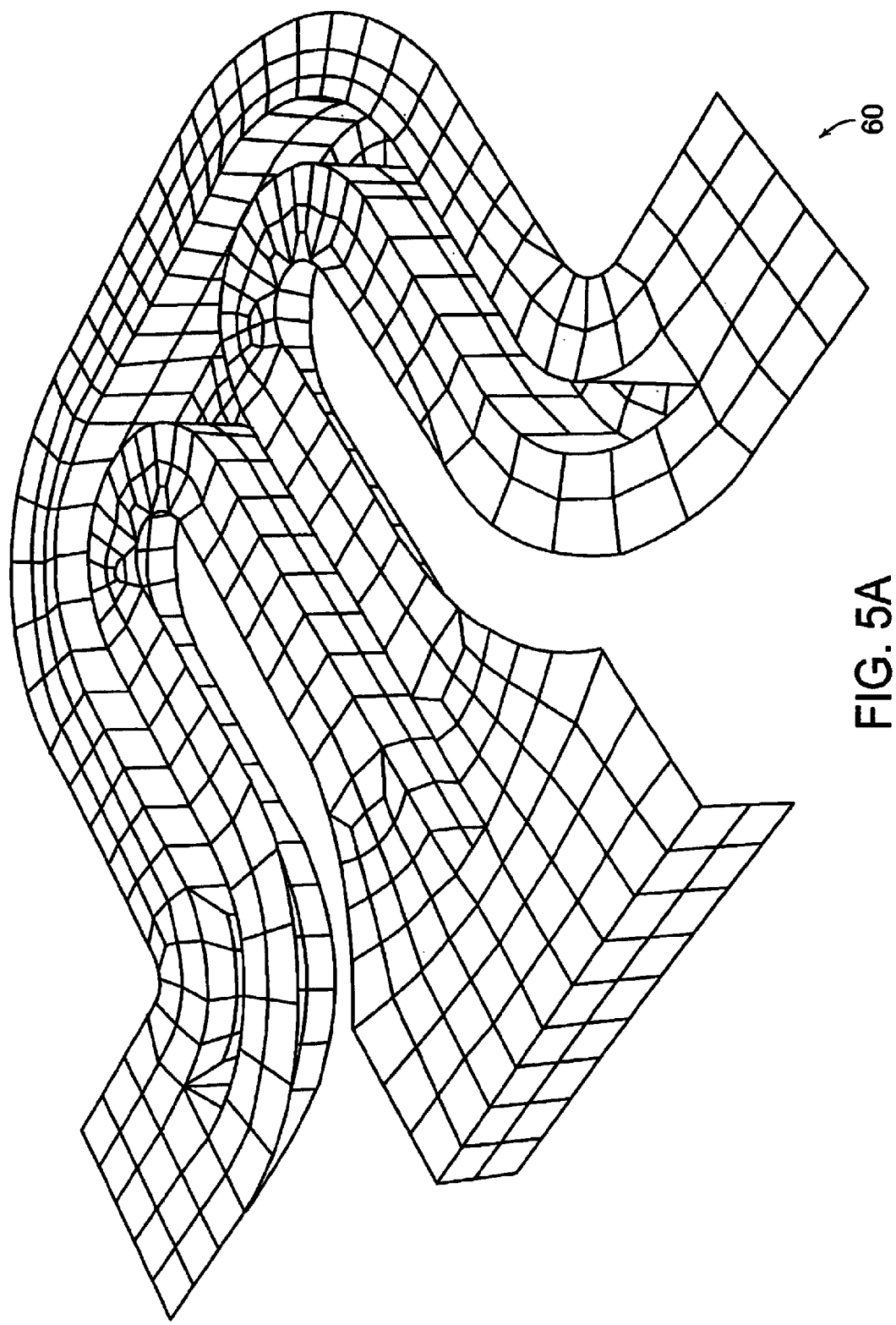
FIGS. 5A and 5B are perspective views of flexure hinges in accordance with other embodiments of the invention.
Figure 5B:
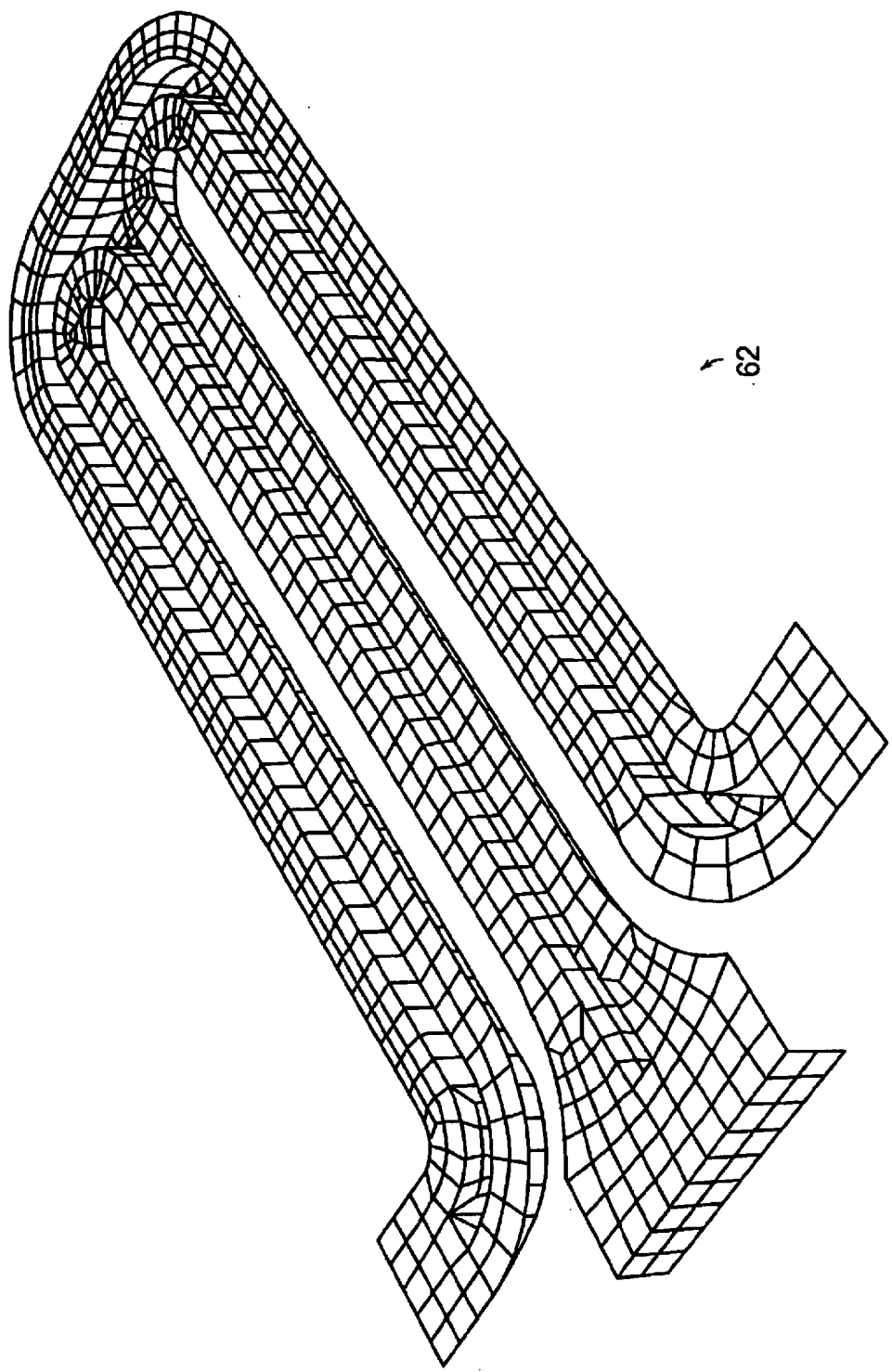

FIGS. 5A and 5B illustrate further alternative flexure hinges 60, 62. The flexure hinges 60, 62 have both a folded top view spring arrangement as well as a folded cross-sectional configuration. The FIG. 5B flexure hinge 62 is elongated and generally has greater torsional compliance than the FIG. 5A flexure hinge 60. Accordingly, if the two flexure hinges 60, 62 are used in the same gimbal mechanism, the FIG. 5B hinge 62 can be used for connecting the mirror 32 to the inner gimbal frame 38, and the FIG. 5A hinge 60 can be used for connecting the inner gimbal frame 38 to the outer gimbal frame 36.

The gimbal structure of the mirror-in-a-frame design of the pixel 30 shown in FIG. 2 allows simultaneous movement of the mirror 32 about two perpendicular axes. Accordingly, generally all combinations of mirror rotation can be realized, subject to maximum mirror tilt restrictions. Circular or elliptical mirrors are preferred over square mirrors because circular or elliptical mirrors allow for the placement of electrodes beneath the mirror to be closer to the mirror. This is because, for rotation about a diagonal of a square, a square mirror will have a long lever arm along its diagonal and the electrode must be placed sufficiently far below the mirror to allow for a large swing of the arm. Circular or elliptical mirrors have a smaller maximum lever arm for a given area, and the minimum mirror-electrode distance (along the axis normal to the mirror) requirements are therefore relaxed. By placing the electrodes closer to the mirror, many benefits can be achieved, including increased torque on the mirror at a given voltage. Also, the ratio of an elliptical mirror's major and minor axes can be chosen so that the mirror appears circular to the incident light (often coming in at an angle with respect tot the axis normal to the mirror).

Furthermore, the inner and outer gimbal frames 36, 38 can be configured to obtain the appropriate trade-off between moment of inertia and torque to meet the performance requirements of a given system. For example, the gimbal frames can have an outer square shape with mirror cutout (as shown, e.g., in FIG. 2), or alternatively, a concentric or elliptical shell around the mirror. The particular shape of the gimbal structure can be selected based on desired performance requirements.

Hollowed Out Gimbal Frame Embodiment

As shown in FIG. 6, in accordance with another embodiment of the invention, a movable inner frame 70 of a gimbal structure can include a plurality of etched holes 72. The holes 72 can be recessed or thinned out areas or, alternatively, through-holes. The holes reduce the weight of the frame and give the frame a lower moment of inertia.

Holes in a variety of shapes and arrangements can be provided. Preferably, the gimbal structure includes through-holes in a honeycomb lattice like configuration, which makes the frame particularly light weight, but structurally sound.

The choice of whether through-holes or recesses (or some combination thereof) are used depends on a number of factors including whether or not, and to what extent, control of air damping of the system is desired.

Electrode Structure

Further embodiments of the invention are directed to improved electrodes for actuating mirror motion, and methods for fabricating such electrodes. As previously discussed, electrostatically actuated MEMS mirror devices include electrodes positioned beneath movable mirrors. The electrodes can be selectively charged to generate electrostatic forces to attract and tilt the mirror about a given axis. Generally, two electrodes are provided for each axis of rotation. Other arrangements are also possible. For example, it is possible to use a total of three electrodes for the two axes of rotation.

Prior art electrodes are generally flat and plate-like. They are positioned parallel to the movable mirror with a uniform spacing between the electrode and the movable mirror. Two common problems with such an electrode structure are (1) only a relatively small torque can be generated at small angular displacements of the mirror, and (2) the non-linearity of that torque. The prior art electrodes are positioned sufficiently far from the original (untilted) position of the movable mirror to allow the mirror to move through a wide range of motion. This relatively large distance between the mirror and the electrodes limits the initial electrostatic force that can be applied to the mirror, resulting in lower applied torque, particularly at small angular deflections. Accordingly, high actuation voltages are needed, and the switching speeds are slow.

Furthermore, the shapes of the deflection versus voltage-squared curves of these electrodes are very non-linear, which greatly increases the difficulty of controlling the device externally. This also leads to the "pull-in" phenomenon, which results in instability when the mirror moves to within a certain distance from its original untilted position from a tilted position. Typically, the travel range of mirror is limited to between 30 to 50% of the original gap, which is the distance between the edge of the mirror in an untilted position and the electrode.

Previous attempts to linearize the deflection versus voltage-squared curves, avoid the pull-in phenomenon, and increase torque generally have been made using comb-drive actuation mechanisms. Such mechanisms generally suffer from problems of fabrication complexity and relatively low production yields.

Electrodes in accordance with various embodiments of the invention generally include the advantages of comb-drive actuation mechanisms, while maintaining the ease-of-fabrication and high yield aspects of conventional electrostatic plate actuation mechanisms.

Figure 7A:
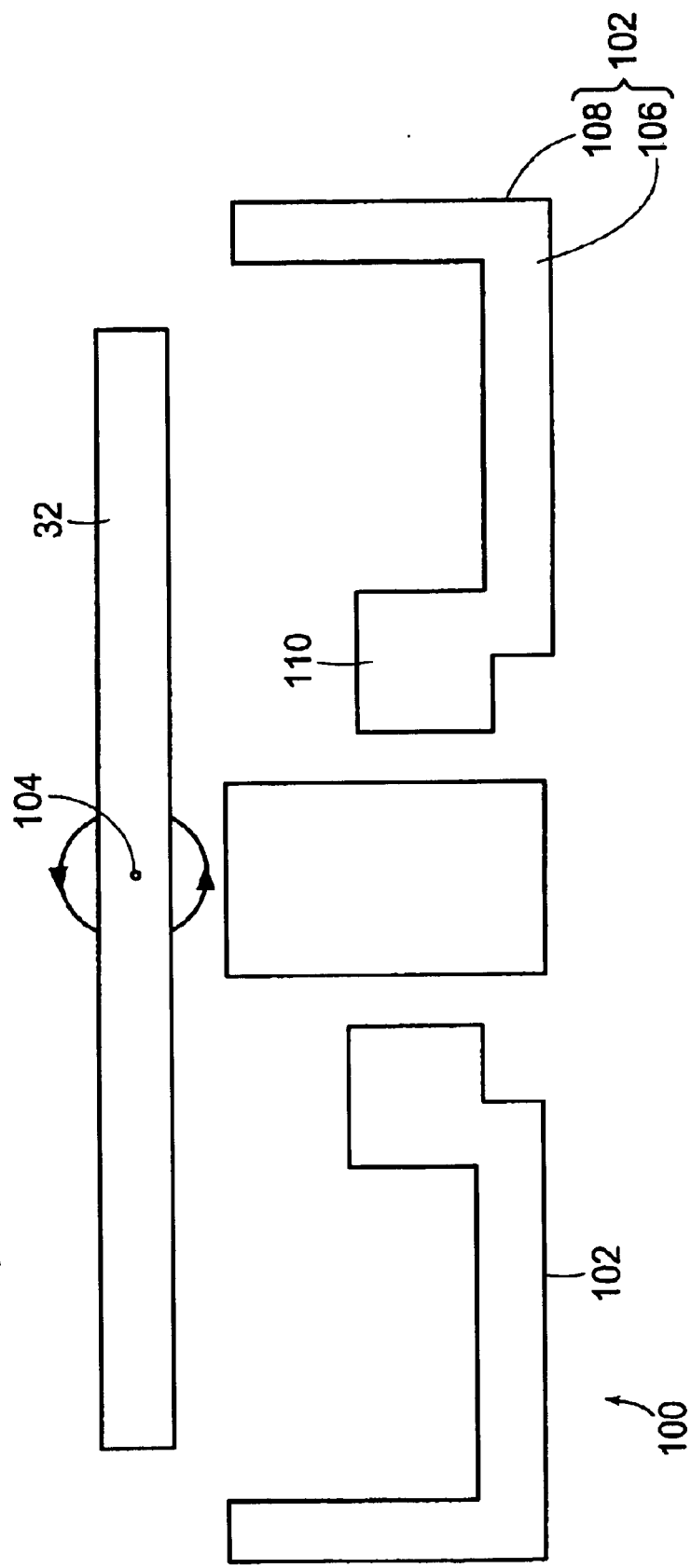
FIGS. 7A and 7B are schematic cross-sectional and plan views, respectively of an electrode structure in accordance with one embodiment of the invention.
Figure 7B:
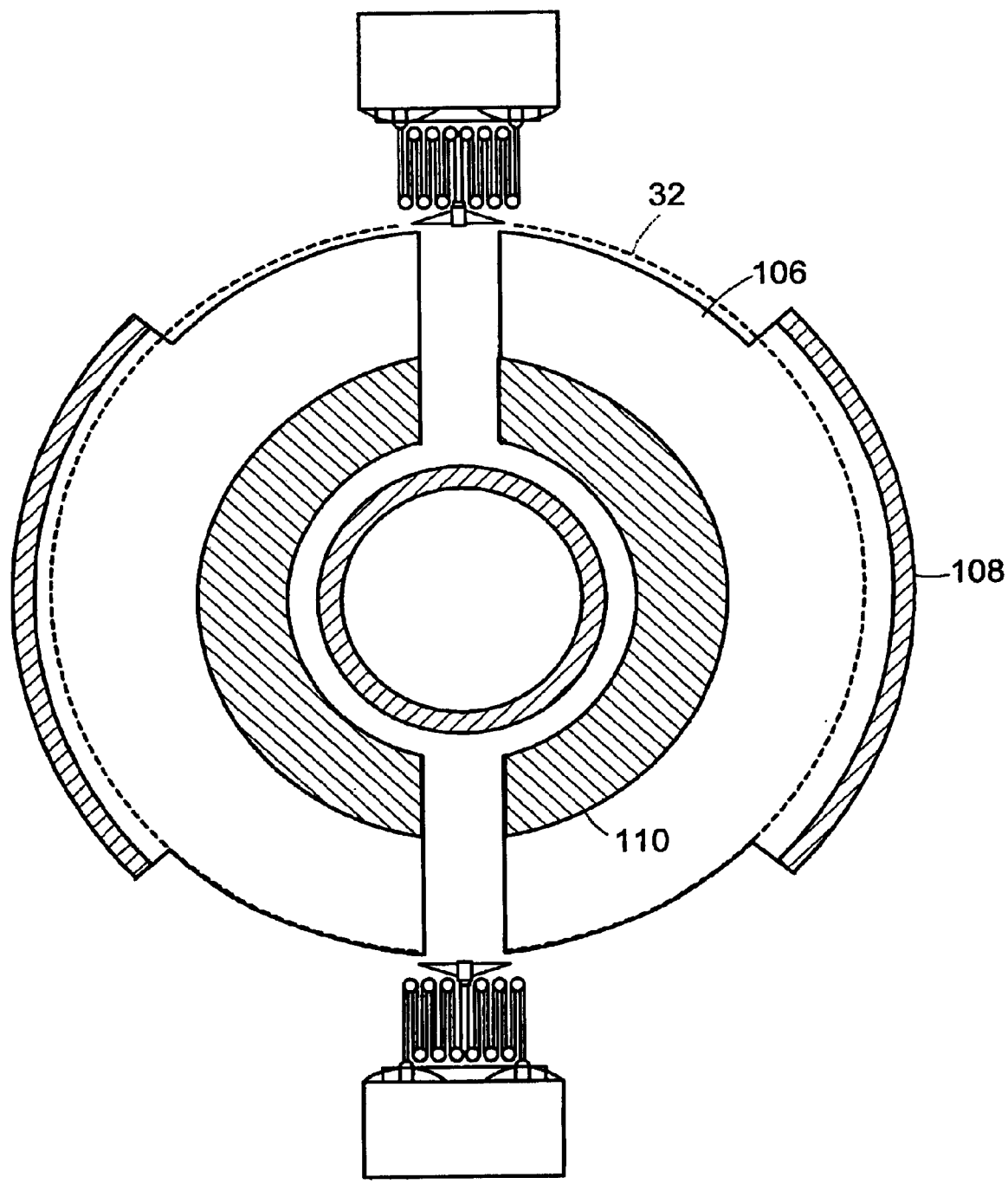

FIG. 7A is a simplified cross-sectional view of a mirror device 100 having an electrode structure 102 in accordance with one embodiment of the invention. FIG. 7B is a top view of the electrode structure 102 (with the mirror 32 indicated by a dashed line). For simplicity, only one axis of rotation 104 for the mirror 32 is illustrated. It should be understood, however, that multiple axes of rotation are possible with electrode structures in accordance with the various embodiments of the invention. In the FIG. 7 embodiment, two electrodes are provided. Each electrode includes an inner portion 106 generally beneath the mirror 32, and an outer portion 108 near the rim of the mirror. The inner portion of each electrode is stepped with an inner raised portion 110 underneath the mirror 32 nearer to the mirror center. The inner raised portions 110 of the electrodes provide additional torque without significantly limiting the range of motion of the movable mirror 32.

While each electrode is shown having joined inner and outer portions, it should be understood that the inner and outer portions can be separate electrodes that can be independently actuated.

The outer portions 108 of the electrodes are raised and positioned outside of the path or sweep of the mirror 32 so as not to restrict mirror movement. The outer electrodes 108 generate electrostatic forces that provide a relatively large initial torque to the mirror 32. The outer electrodes 108 act on the outer portion (i.e., rim) of the mirror, where there is the longest lever arm. Low voltages can accordingly be used to cause large mirror displacements. The outer electrodes 108 also help to linearize the voltage versus angular deflection curve for the movable mirror by providing "pull back" on the mirror 32 as the outer edge of the mirror 32 rotates past the top edge of the outer electrodes 108. This helps to linearize the voltage versus angular deflection curve for the movable mirrors.

Because the outer portions 108 of the electrodes are located relatively far from the rotation axis 104 of the mirror, the ratio of the torque to the downward force generated by these electrodes is high. This suppresses the undesired so-called "piston" mode mirror movement, in which the entire mirror moves up and down rather than rotates about the axis.

Furthermore, for a curved rotator, different parts of the rotator pass the top of the secondary electrode at different angles. Accordingly, the shape can be chosen to provide an even more optimized angle vs. voltage curve.

Figure 8A:
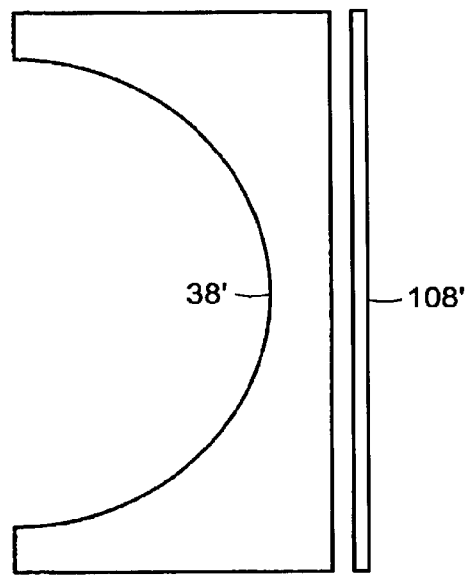
FIGS. 8A–8C are plan views of portions of electrode structures and gimbal frames in accordance with other embodiments of the invention.
Figure 8B:
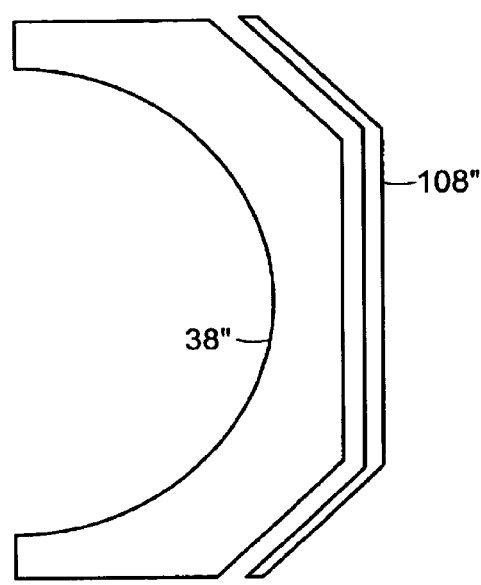
Figure 8C:
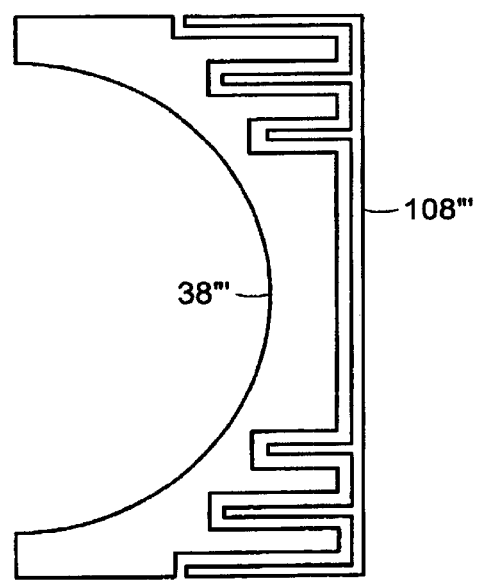

The outer portions 108 of the electrodes can have various configurations relative to the inner movable gimbal frame of the gimbal structure supporting the mirror. This can affect the torque generated and torque versus angle curves. A few examples of different shapes of the outer electrodes 108 and the adjacent portion of gimbals are shown in top view in FIGS. 8A–8C. FIG. 8A illustrates a generally straight outer electrode (108')-gimbal (38') arrangement. FIG. 8B illustrates a piecewise curved electrode (108")-gimbal (38") arrangement. FIG. 8C illustrates a comb-fingers like arrangement of the electrode 108''' and gimbal 38'''. The particular configuration selected can be based on a number of different criteria such as e.g., desired torque, moment of inertia, alignment accuracy for bonding the mirror-gimbal structure to the raised electrode structure, and lateral vibration expected.

The inner portions 106 of the electrodes can have various geometric shapes. For example, in accordance with another embodiment of the invention, the inner portion 106' of each electrode has a multiple stepped geometry (as shown, e.g., in FIG. 9. Providing the additional steps enable the torque-vs.-angle behavior of the system to be more accurately tailored.

An inner electrode structure 106" in accordance with another embodiment has a gradually sloped configuration is shown in FIG. 10.

An inner electrode structure 106''' in accordance with another embodiment includes only outer electrodes as shown in FIG. 11.

In accordance with a further embodiment of the invention as shown in FIGS. 12A and 12B, a bump-stop 120 is provided to restrain the mirror 32 from over-rotating and possibly shorting with the electrodes, which may be uncovered. The bump-stop 120 can be formed, e.g., by depositing oxide between the left and right electrodes underneath the mirror. The bump stop can have an annular configuration as shown in FIG. 8B, which illustrates the top view of the bump stop.

The above described electrode structures can also generally be used in a parallel plate actuator that is designed to move a mirror up and down in a piston-like motion rather than rotate.

Electrode Fabrication

Raised electrode structures in accordance with various embodiments of the invention can be fabricated using the process described in the example below with reference to FIGS. 13A–13M. The initial steps in the process relate to forming a through-wafer interconnect device for supporting and providing electrical connections to mirror pixel devices.

(1) Provide a starting glass wafer 200 (e.g., Pyrex 7740) as shown in FIG. 13A. This wafer will form the through-wafer interconnect device on which the electrode structure can be supported. Other insulating materials such as, e.g., quartz, alumina, ceramic, etc. can also be used to form the interconnect device. Silicon can also be used if insulated, e.g., with a growth of thermal oxide thereon.

(2) Deposit a seed layer 202 (e.g., Ti/Cu) on one or both sides of the wafer 200 depending on whether a subsequent powder blasting step is to be performed on one or both sides of the wafer. For ease of illustration, the process being described illustrates powder blasting from only one side of the wafer. FIG. 13A accordingly shows a seed layer 202 deposited on only the front side of the wafer 200.

(3) Pattern thick photoresist 204 as mold for copper plating on the seed layer 202 of the wafer 200 as shown in FIG. 13C. (If powder blasting is to be performed on both sides of the wafer, pattern the photoresist on both sides.)

(4) Electroplate copper 206 in the photoresist mold and strip the photoresist as shown in FIG. 13D. The copper can be annealed at this point to change material properties as required for given electroplating/blasting conditions. The copper is used as a mask for subsequent powder blasting. Other materials can also be used such as, e.g., polymer films.

(5) Use powder blasting or AJM (Automatic Jet Machining) to drill very small holes 208 through the Pyrex wafer 200 using the copper mold as a mask as shown in FIG. 13E. (If powder blasting is to be performed from both sides, front to backside alignment should be performed.) These holes may also be formed using other methods such as, e.g., ultrasonic drilling, and laser ablation. At this point, after stripping the masking material, the wafer can be annealed to relieve any stress induced during the formation of the holes.

(6) Pattern metal 210, e.g., Ti/Au, using dry resist as shown in FIG. 13F. This can be done, e.g., either using lift-off or by wet etching. At this stage, it is possible to attach the wafer to a carrier wafer and use conventional photoresist or polyimide "tenting" for patterning especially small features.

Figure 13G:
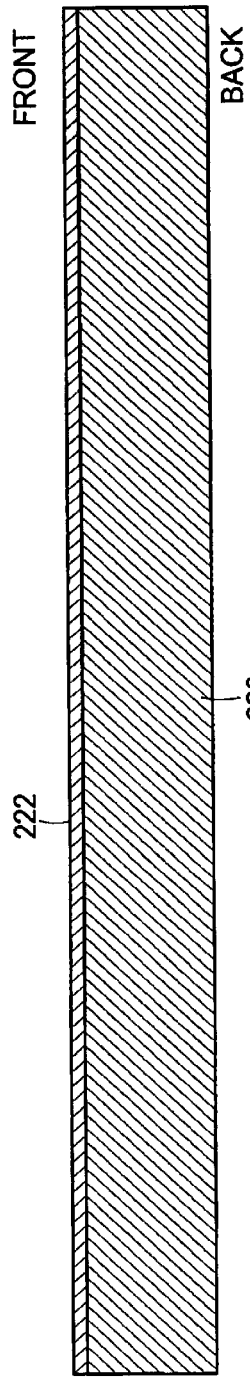

(7) On a separate, preferably low resistivity, double-side polished silicon wafer 220 grow a thick oxide 222 (about 1.5 um) and strip off the backside as shown in FIG. 13G. The thickness of the wafer can, e.g., be 250 um.

Figure 13H:
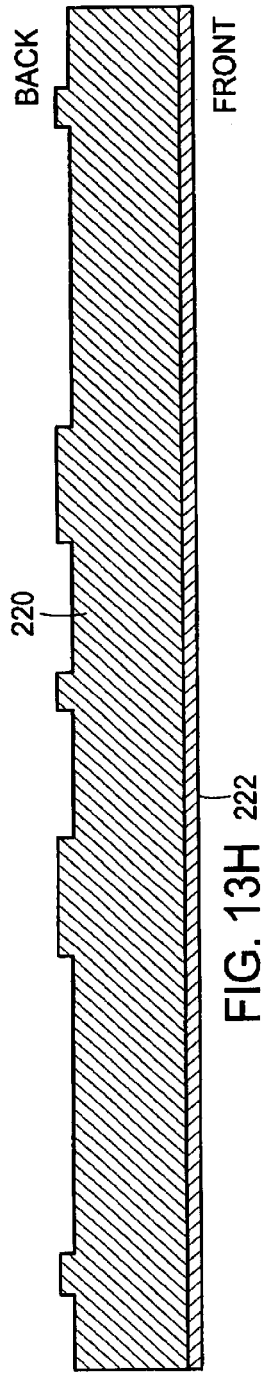

(8) Pattern and etch the backside to a depth of about 50 um with DRIE as shown in FIG. 13H.

Figure 13I:
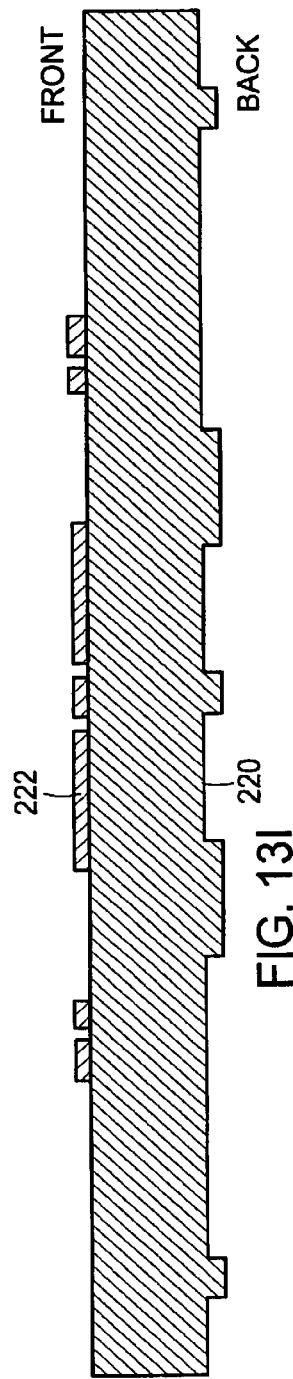

(9) Remove the oxide 222 in areas that will form the inner lower electrodes as shown in FIG. 13I.

Figure 13J:
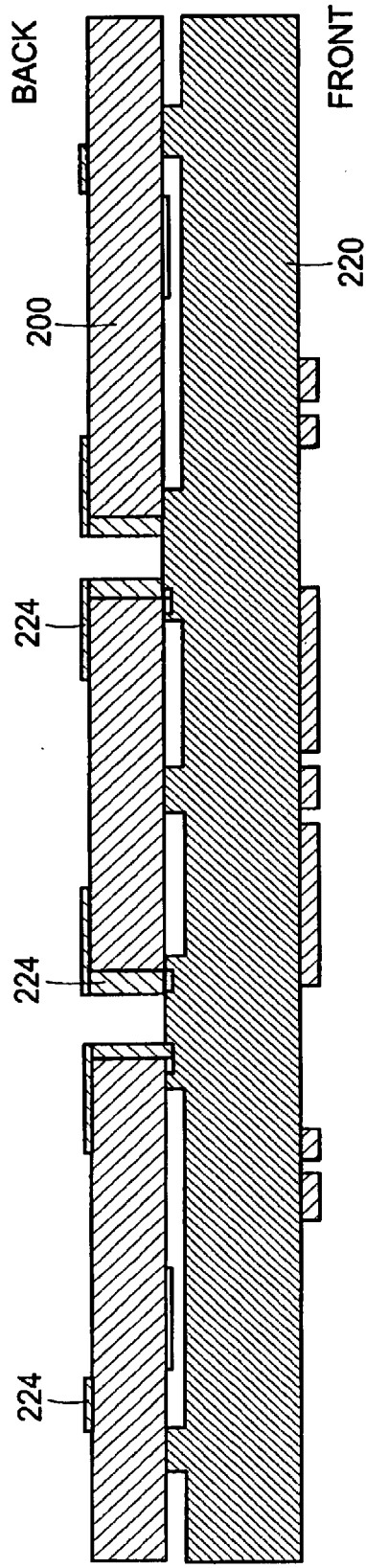

(10) Bond the silicon and Pyrex wafers 220, 200 as shown in FIG. 13J. Also, pattern the backside of the glass wafer with metal 224, e.g., Ti/Au, using any of a number of methods including dry-resist, conventional photoresist, polyimide or tenting.

Figure 13K:
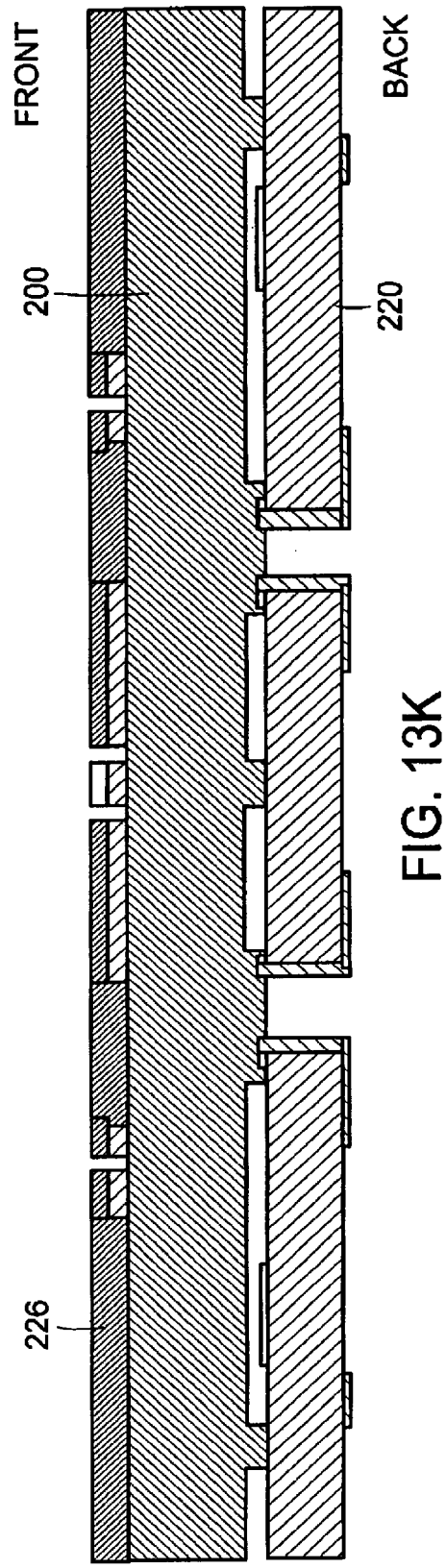

(11) Deposit masking material 226, e.g., Al, on the topside of the silicon wafer and pattern as shown in FIG. 13K.

Figure 13L:
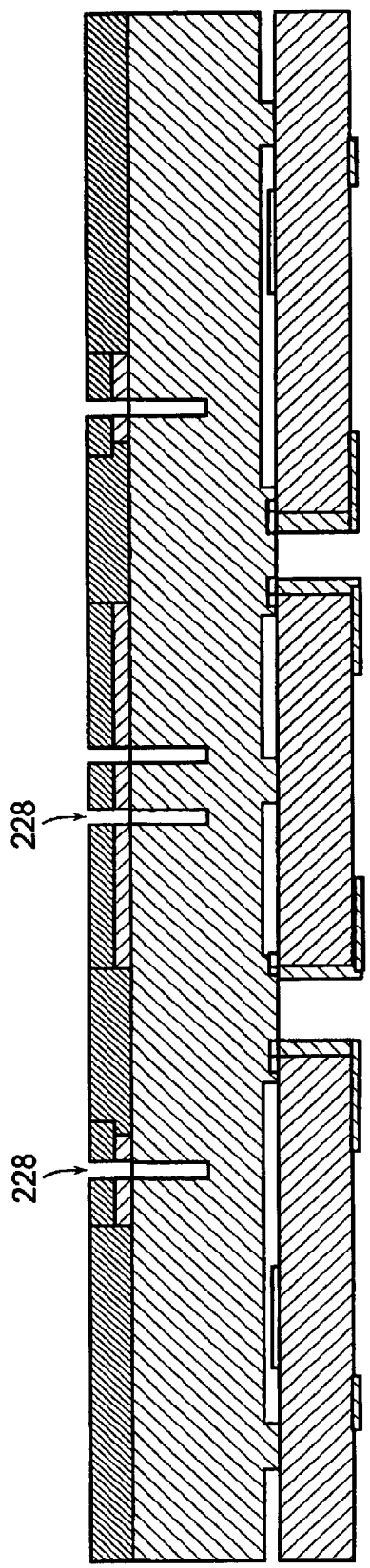

(12) Etch grooves or trenches 228 down to a depth of about 100 um as shown in FIG. 13L.

Figure 13M:
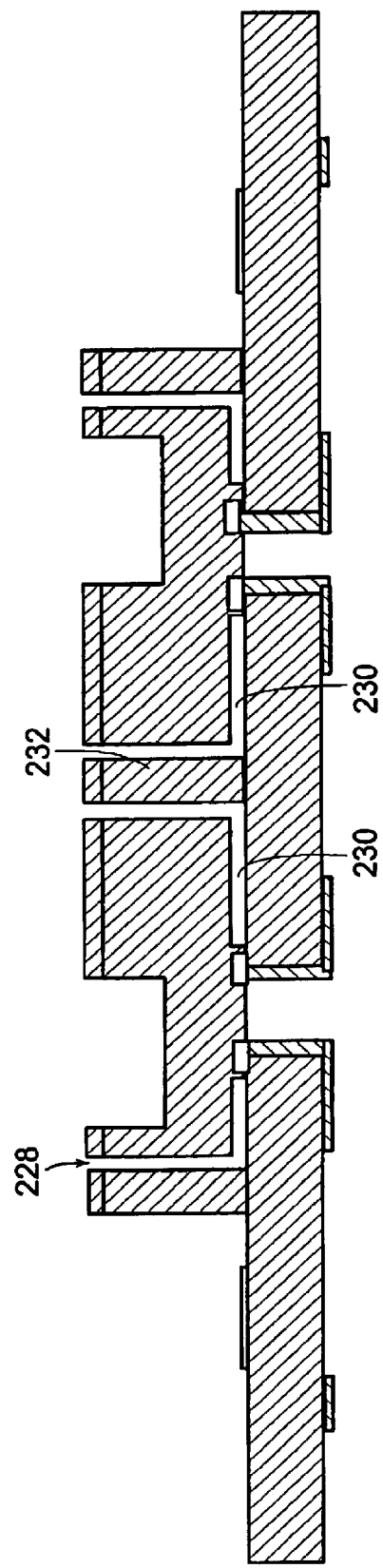

(13) Strip Al and continue etching to the desired depth for the lower electrodes, punching through to the areas 230 etched from the back during the etch as shown in FIG. 13M. A bump stop could be formed from the masking oxide on the top a central member 232 forming a grounded electrical shield between two electrodes.

Fabrication of Through-Wafer Interconnects

Another embodiment of the invention is directed to providing electrical connections to a large number of pixel devices using a through-wafer interconnect device. This device allows for the transfer of the electrical leads from the electrodes for driving each mirror to external contacts directly through a wafer on which the mirrored array is supported. These leads can then be connected to external circuitry using, e.g., area array technology. This embodiment of the invention is generally directed to a device for electrically connecting devices on one surface from leads on another surface. Devices in accordance with this embodiment provide such interconnects while allowing only relatively small parasitic capacitances both on the through-wafer part of the connection routing and in any additional routing on either side of the wafer.

A fabrication process in accordance with this embodiment of the invention involves fabricating structures that contain through-wafer electrical interconnects. This process generally involves making holes through a preferably glass wafer (e.g., a Pyrex wafer), and either completely or partially filling these holes with a conducting material, and then patterning the conducting material on one or both sides of this wafer. The use of an insulating material for this wafer helps facilitate a reduction in unwanted parasitic capacitances in the system.

There are a number of different processing techniques for fabricating structures with through wafer interconnects. The preferred method as described below involves fabricating the holes by using powder blasting or AJM. This process allows the fabrication of through holes in Pyrex, which is otherwise difficult to machine with small holes that are placed close together. Furthermore the process is more economical and has higher throughput than serial techniques (such as laser ablation). Pyrex is a widely used material that can be anodically bonded to silicon and is also TCE (Thermal Coefficient of Expansion) matched to silicon. Other aspects of the process that relate to patterning material in and around the holes are not dependent on the particular process used to make the holes.

Figure 14B:
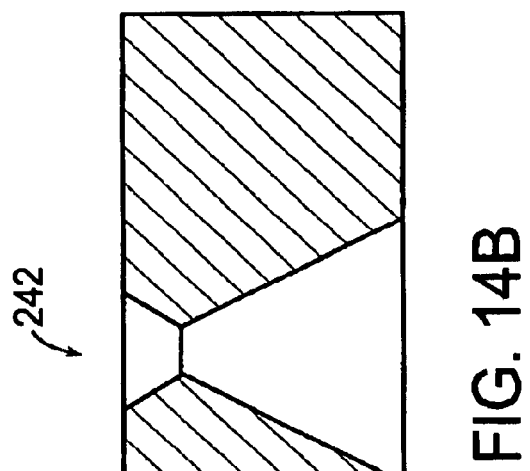
FIGS. 14A and 14B are cross-sectional schematic views of holes powder blasted from two sides of a wafer used in the fabrication of a glass wafer interconnect device.
Figure 14A:
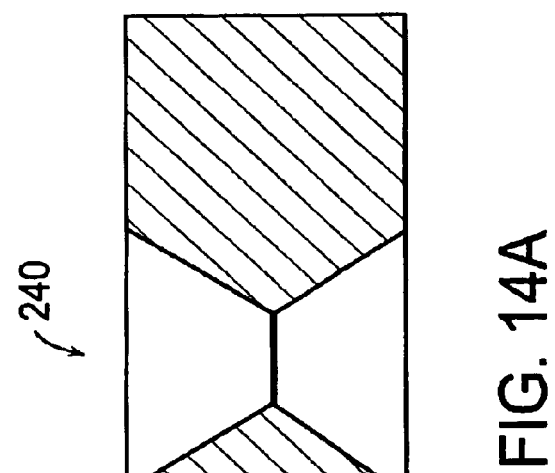

The general process for fabricating the through-holes with powder blasting is as shown in FIGS. 13A–13E described above. Various parameters are chosen for the given structure of the holes being blasted and the desired profile, including, e.g., masking material and method of implementation, size and nature of particles used for blasting, and blasting parameters (size of nozzle, angle of nozzle, pressure, etc.). Also, small through-holes can be made in thicker wafers than otherwise possible by blasting the wafer from both sides using front to backside alignment. This commonly creates a through-hole 240 with an hourglass type profile as shown, e.g., in FIG. 14A. Also the mask openings can be chosen differently on different sides to give better control of each side's openings as also shown, e.g., in the through-hole 242 of FIG. 14B.

Once the through holes have been formed in the wafer, a number of techniques can be used to pattern conductive material on both sides of the wafer. One approach is to electroplate up plugs through the wafer from a base and then lap and polish both sides of the wafer in order to make each side suitable for subsequent processing (photolithography, electroplating, etc.). If the holes are large and or close together, then a soft metal is preferable over a hard one in order to allow for elevated temperature post-processing without causing cracking from TCE mismatch induced stress on the wafer. These holes can then serve to electrically connect the topside of the Pyrex wafer to the backside. The fabrication process for these conducting vias is outlined below and described in connection with FIGS. 16A–16F below.

If the holes are not plugged, there are several ways to pattern material on either side of the wafer. One way to pattern metal is to spin thick photoresist on the wafer and then bake out very slowly. This can be particularly effective if minimum feature sizes are not too small and if a carrier wafer or a non-vacuum chuck is used. Also, so called dry-resist can be used for patterning of large features (>15 um). This known process includes applying photoresist as a sheet that is laminated onto the wafer.

However, if very small features are to be reliably patterned, a different approach can be used. One possible approach involves the use of polyimide. When polyimide is spun on the wafer it forms membranes over the holes. If the baking out of the solvents is done slowly enough, the membranes can remain intact through a full cure. The wafer then has much smaller topography and conventional photoresist can be spun on the wafer, allowing for patterning of smaller features. The polyimide can be removed after patterning the underlying material, making the technique applicable to those processes involving polyimide as well as those that do not. Other similar materials with similar properties could be used instead of polyimide such as, e.g., BCB (benzo-cyclob-butene). This process can be applied to a wafer of any type with holes fashioned in generally any way.

Figure 15A:
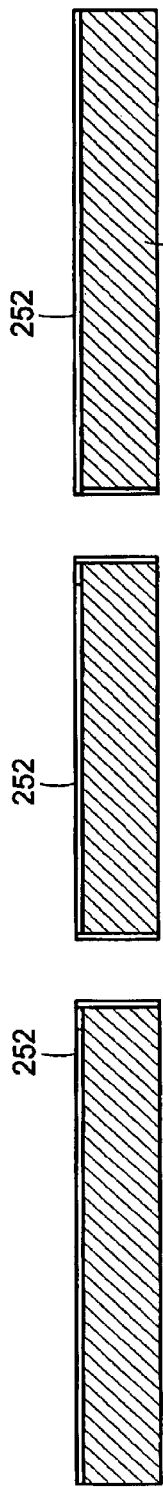

This process is described in greater detail below with reference to FIGS. 15A–15E. Note the process shown is just one example of the use of the tenting process. It can also be used with lift-off, and if the carrier wafer remains attached, the process can leave the metal or other material to be patterned within the holes. The particular embodiment is described below:

(1) Provide a Pyrex wafer 250 with holes, e.g., by using the process described above in FIGS. 13A–13E. Evaporate or sputter Ti/Au 252 on the Pyrex wafer as shown in FIG. 15A. If evaporation is used, the wafer can be placed at an angle with respect to the line of sight between the evaporation source and the wafer. The evaporation can be carried out with a rotatable substrate holder.

Figure 15B:
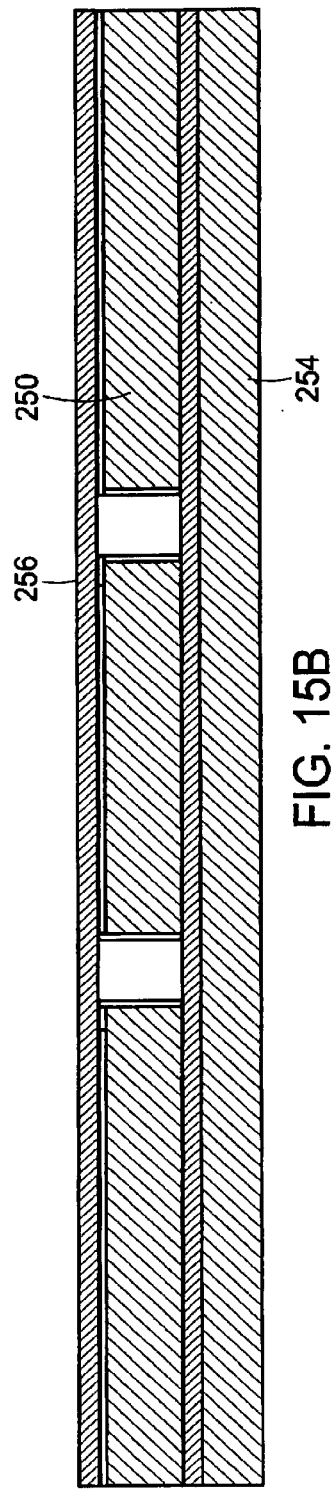

(2) Attach the wafer 250 to a carrier wafer 254 (or alternately apply material such as cellotape to the back of the wafer) and spin polyimide 256 on the wafer and softbake slowly as shown in FIG. 15B.

Figure 15C:
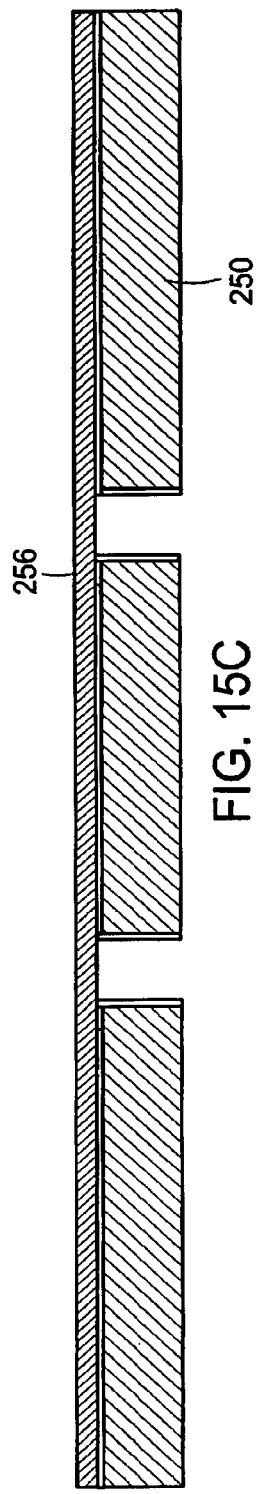

(3) Remove carrier wafer 254 (or cellotape) and cure polyimide as shown in FIG. 15C.

(4) Deposit Al 258 on top side and pattern and etch, and then use as hard mask for oxygen plasma etch of polyimide as shown in FIG. 15D.

(5) Attach cellotape to back of the wafer and etch Ti/Au. Remove cellotape and strip resist (if any remains after oxygen plasma), Al and polyimide as shown in FIG. 15E.

To obtain full metal coverage along the sidewall of the holes a number of methods are available including, but not limited to: sputtering from one or both sides, high-angle evaporation with rotation from one or both sides, either of the above followed by either electroless plating or electroplating, CVD (Chemical Vapor Deposition) deposition of metal.

Figure 16A:
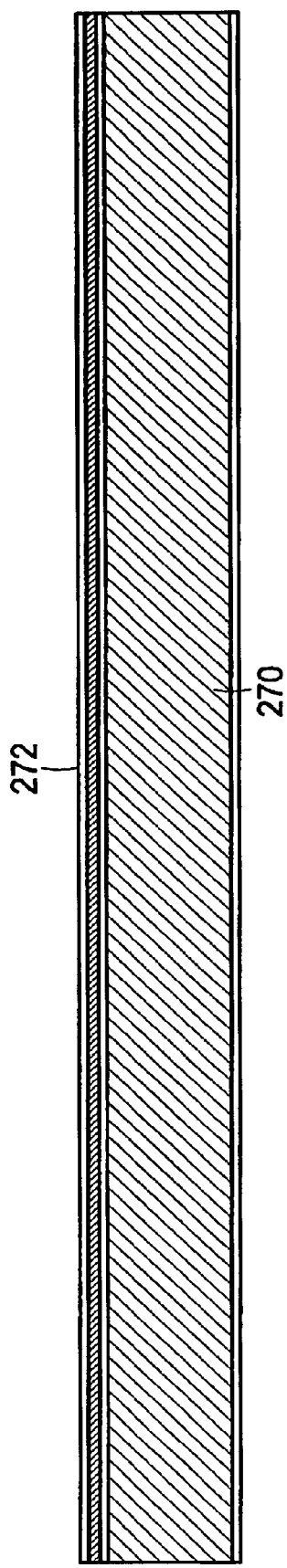

A process to fill the holes with conducting plugs is described, e.g., in FIGS. 16A–16F. This process is as follows:

(1) Spin resist on a pre-oxidized silicon wafer 270, hardbake, and deposit Ti/Au 272 as a seed layer for the subsequent electroplating as shown in FIG. 16A.

Figure 16B:
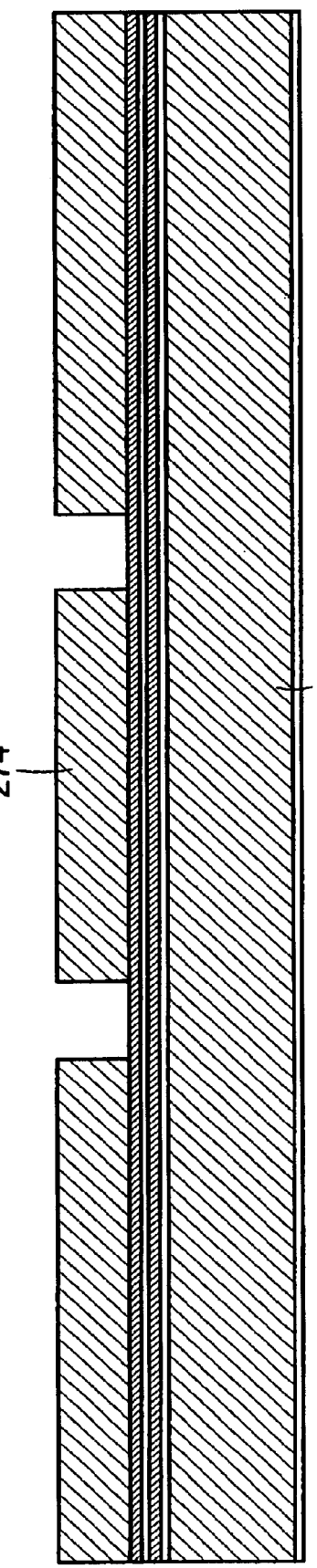

(2) Spin resist on top of the seed layer, attach the Pyrex wafer 274 (formed, e.g., as previously described in FIGS. 13A–13E) to the wafer 270, and then bake as shown in FIG. 16B.

(3) Place wafer stack in oxygen plasma and remove resist from the bottoms of the holes as shown in FIG. 16C.

(4) Electroplate metal 276 (e.g., gold) up through the holes as shown in FIG. 16D.

(5) Lap and polish wafer from topside as shown in FIG. 16E.

(6) Remove carrier wafer and lap and polish the backside if desired as shown in FIG. 16F.

At this point, the wafer is ready for conventional lithography on both sides and has conducting plugs electrically connecting the two sides together.

In accordance with another embodiment, an additional process is used to provide a smoother surface for subsequent lithography as shown in FIGS. 17A–17D. This process involves the use of a known boron etch-stop method.

(1) Grow native oxide 292 on silicon wafer 290, strip off backside and pattern on topside as shown in FIG. 17A.
(2) Implant the topside of the wafer 290 with large dose of P-type dopant 294 (e.g., boron), strip the oxide 292, and anneal as shown in FIG. 17B. The parameters chosen for the implantation and the subsequent anneal generally determine the thickness of this layer.
(3) Anodically bond this silicon wafer to the glass wafer 296 with holes (formed, e.g., as previously described in FIGS. 13A–13E), aligning the heavily doped layers to the through-hole openings as shown in FIG. 17C.
(4) Dissolve the silicon wafer in EDP (ethylene diamine pyrocathecol), leaving silicon membranes 294 over the holes as shown in FIG. 17D. These membranes are very conductive as a result of their heavy implantation. This side is now suitable for subsequent patterning.

In accordance with another embodiment, a similar structure can be formed using an SOI (silicon on insulator) wafer instead of a selectively doped silicon wafer. This process is illustrated in FIGS. 18A–18C.

Figure 18A:
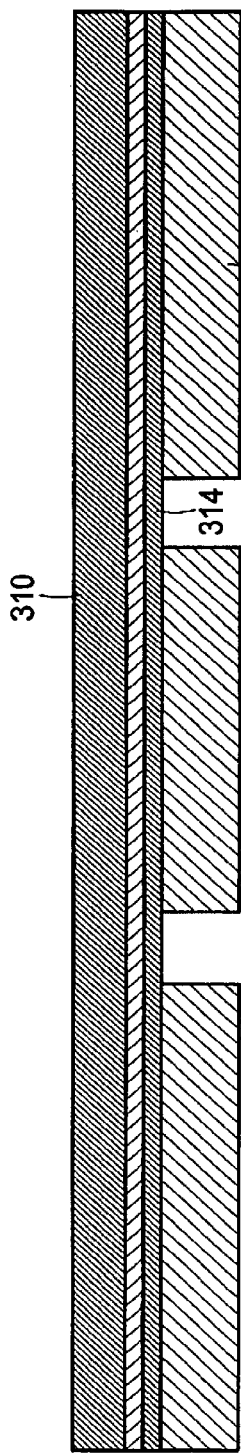
FIGS. 18A–18C are cross-sectional schematic views illustrating the process for creating silicon bridges to span through holes using SOI wafers to enable conventional photolithographic processing in accordance with another embodiment of the invention.
Figure 18B:
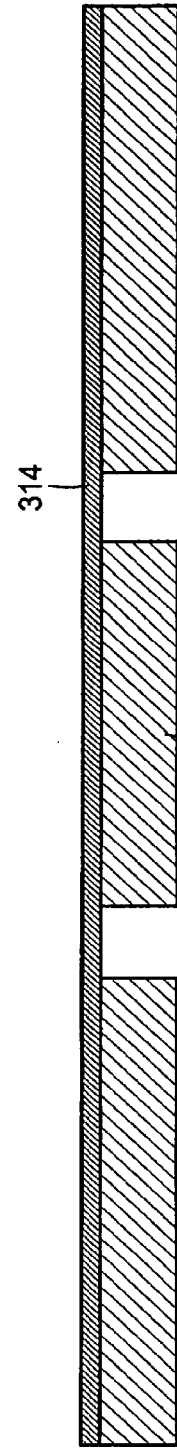
Figure 18C:
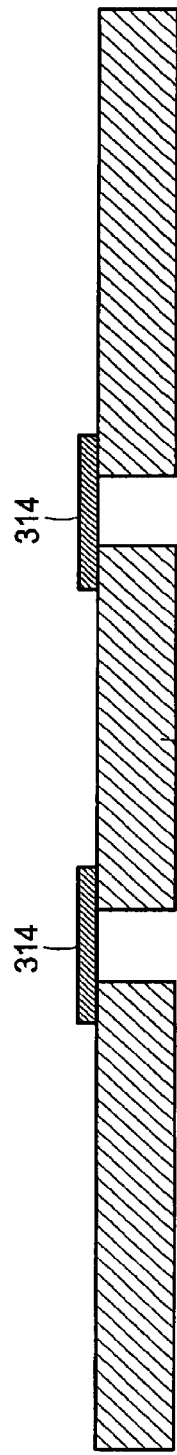

(1) Bond an SOI wafer 310 (device side down) to the glass wafer 312 with holes (formed, e.g., as previously described in FIGS. 13A–13E) as shown in FIG. 18A. The device layer 314 is preferably heavily doped if it is to serve as an electrical lead transfer at the end of the process.
(2) Protect the backside of the wafer stack with any material that can withstand chosen wet etch (e.g., Au), and strip away handle wafer and oxide on top side as shown in FIG. 18B. At this point, the protecting material can be stripped if desired.
(3) Pattern and etch silicon on topside leaving silicon membranes 314 over through holes as shown in FIG. 18C.

Fabrication of MEMS Mirror Arrays

A further embodiment of the invention is directed to a process for making preferably large arrays of mirrors. The process includes a dry-release method process in which polyimide fixes the devices that will eventually be released. The polyimide does not have to completely cover these devices, but can be patterned to fix the devices at their edges. This makes it possible to fabricate an optically smooth and clean surface that is not covered with polyimide, but is nonetheless held in place by it.

The process also allows for the fabrication of flexures in the gimbal structure from polysilicon. This is advantageous because a reliable and uniform polysilicon deposition can be provided, which controls the thickness of the flexures. The spring constants of the flexures can therefore be tightly controlled. This allows for very accurate control of the flexures' torsional spring constants. An additional step in the process enables the polysilicon to be removed from the single crystal silicon that forms the mirror so as to avoid any warping of the mirror from this film.

An example process flow for the general fabrication of the mirror arrays is described below with reference to FIGS. 19A–19M. The process flow describes major processing steps for first the silicon wafer, and then the silicon and glass wafer stack after the two wafers have been bonded.

Figure 19A:
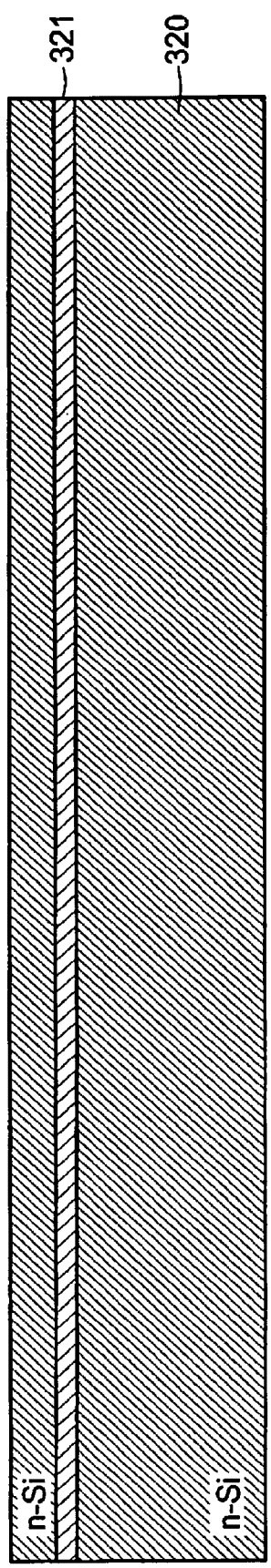
Figure 19B:
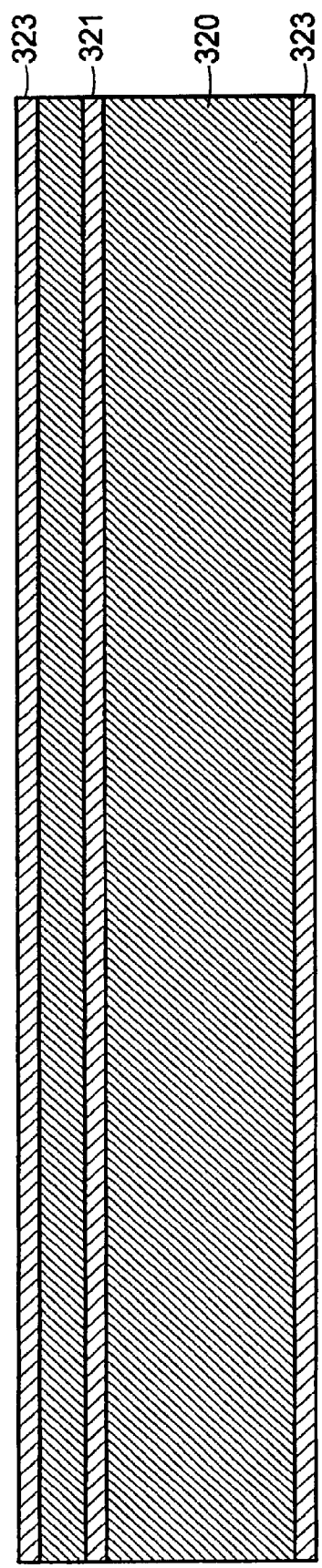
Figure 19C:
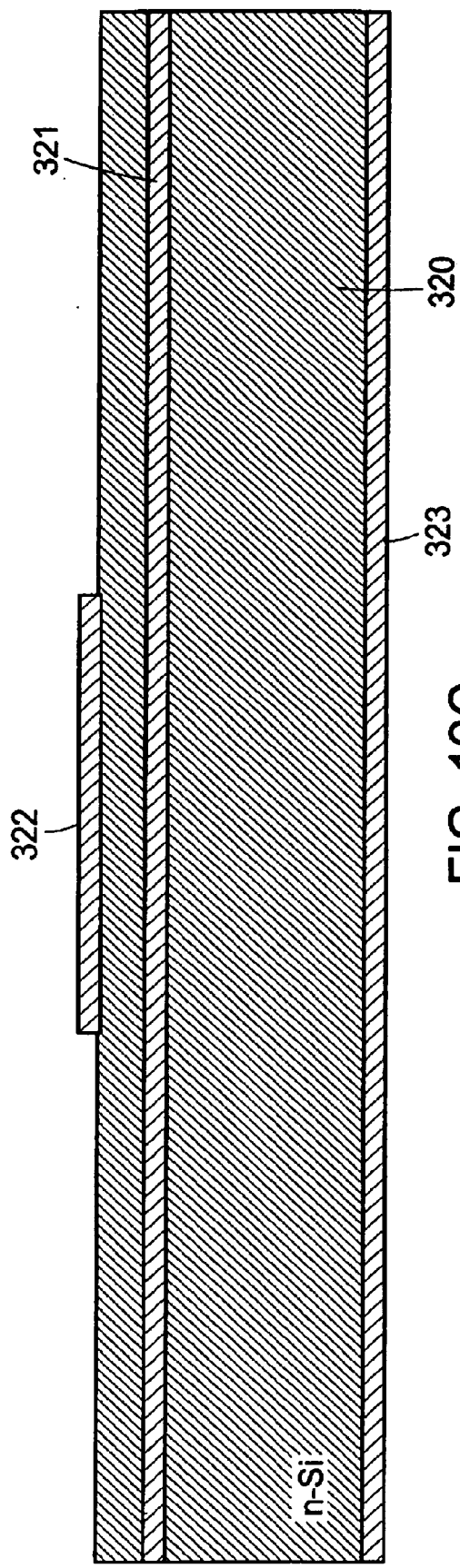
Figure 19D:
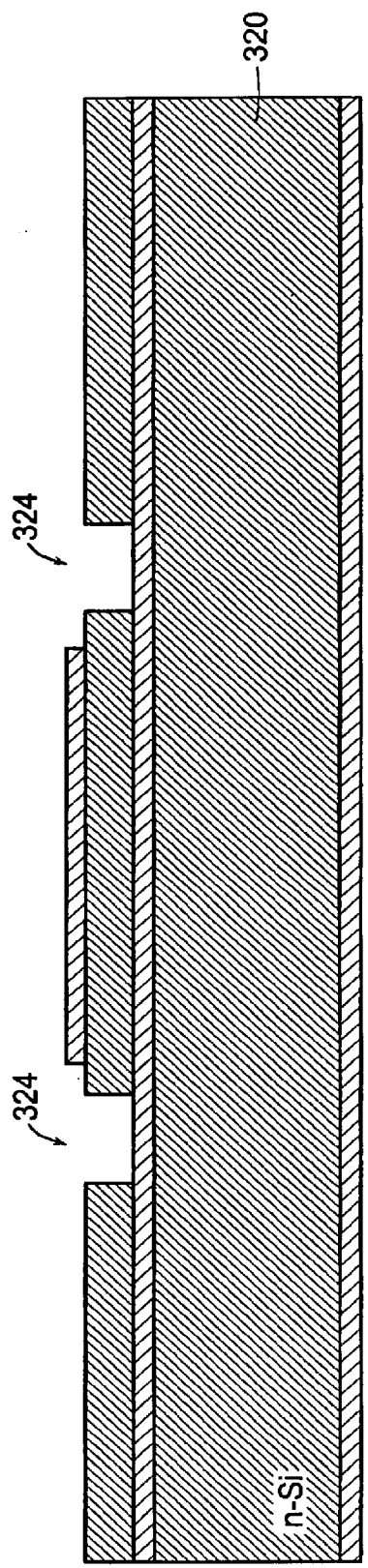
Figure 19E:
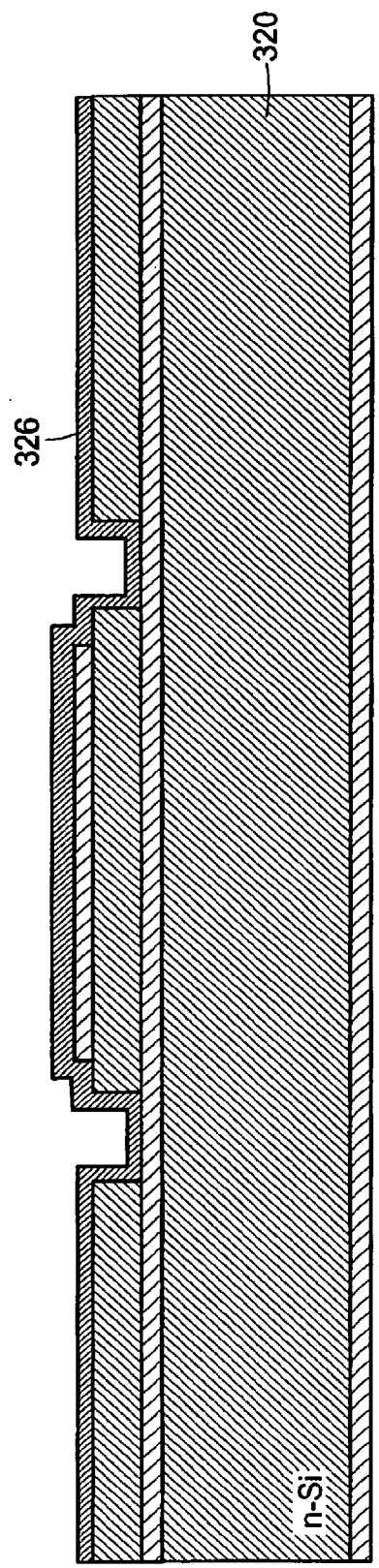
Figure 19F:
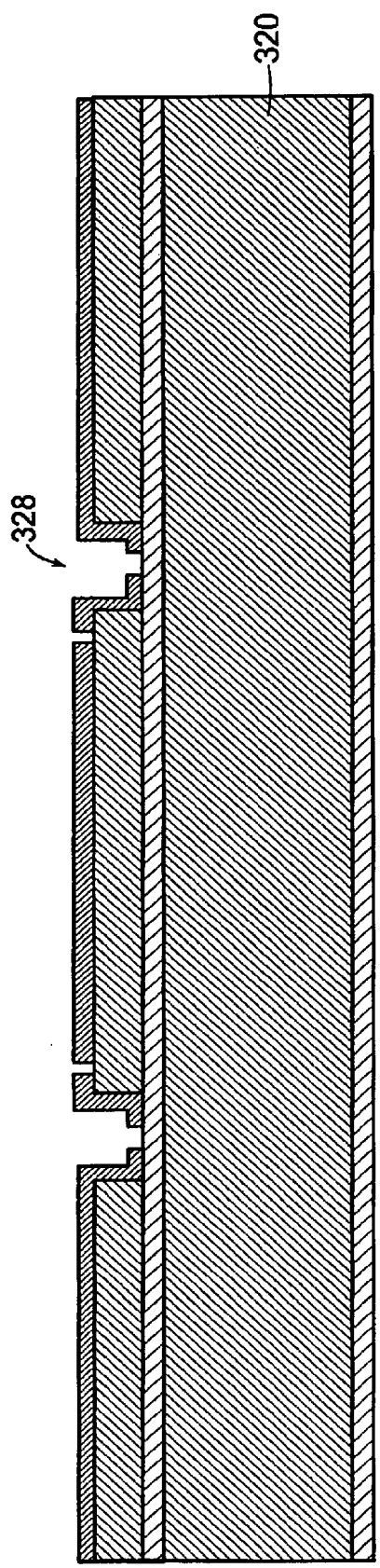
Figure 19G:
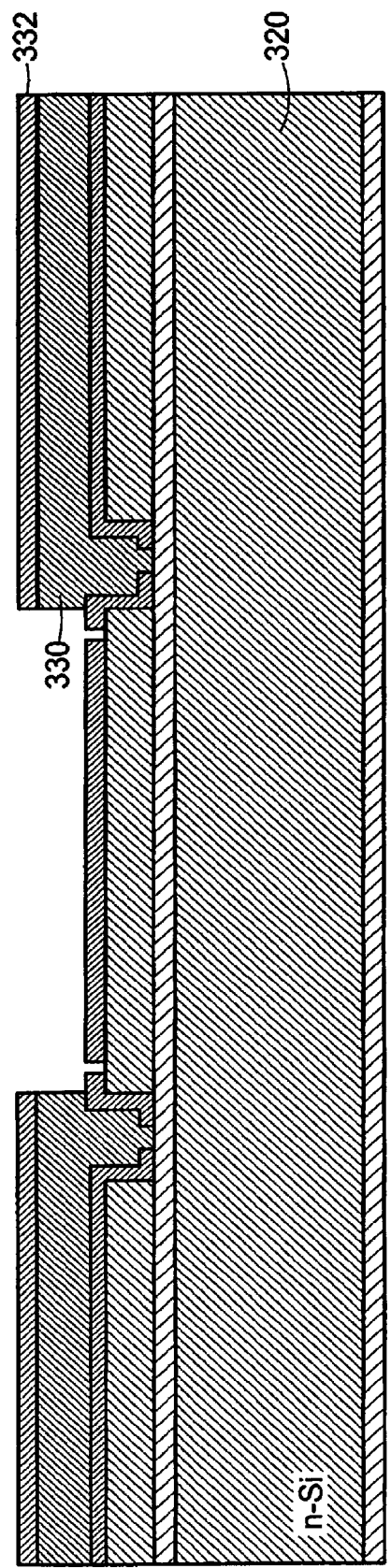
Figure 19H:
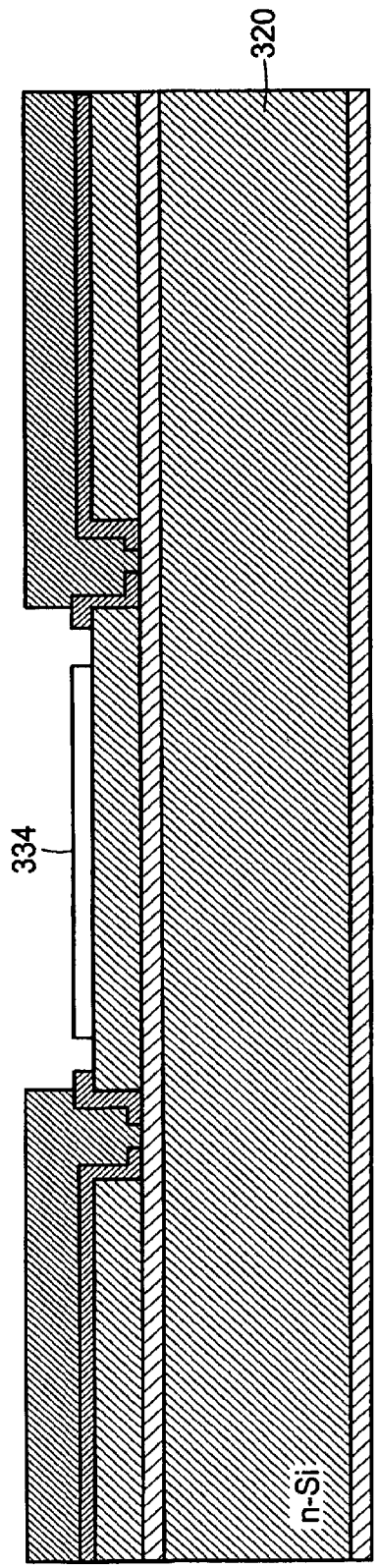
Figure 19I:
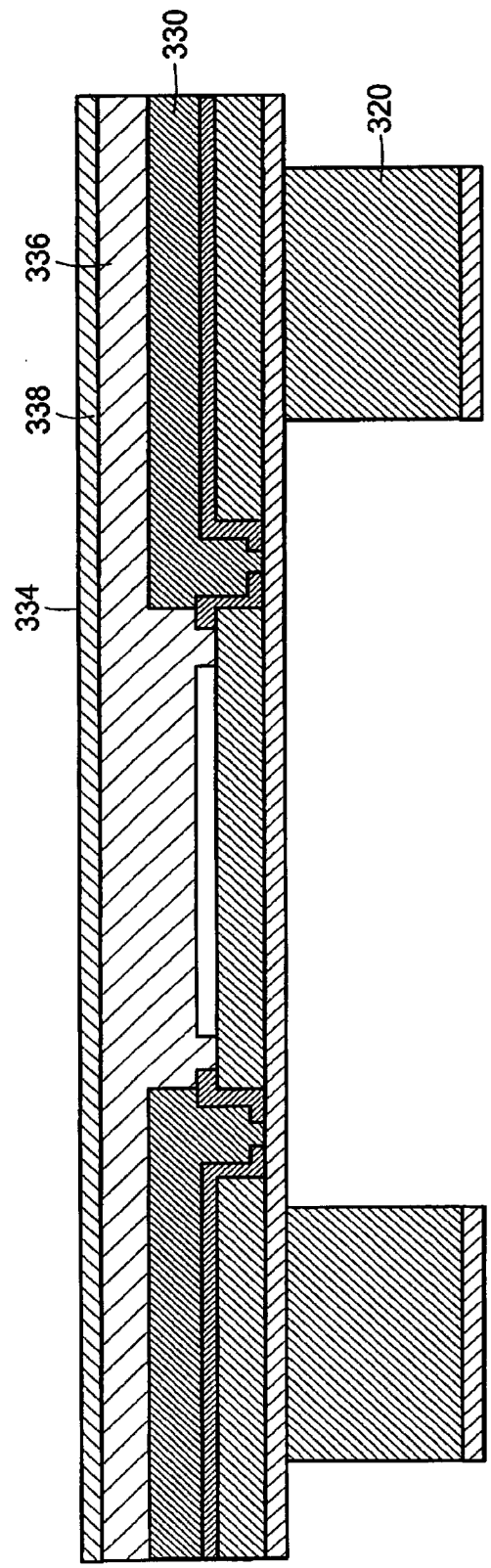
Figure 19L:
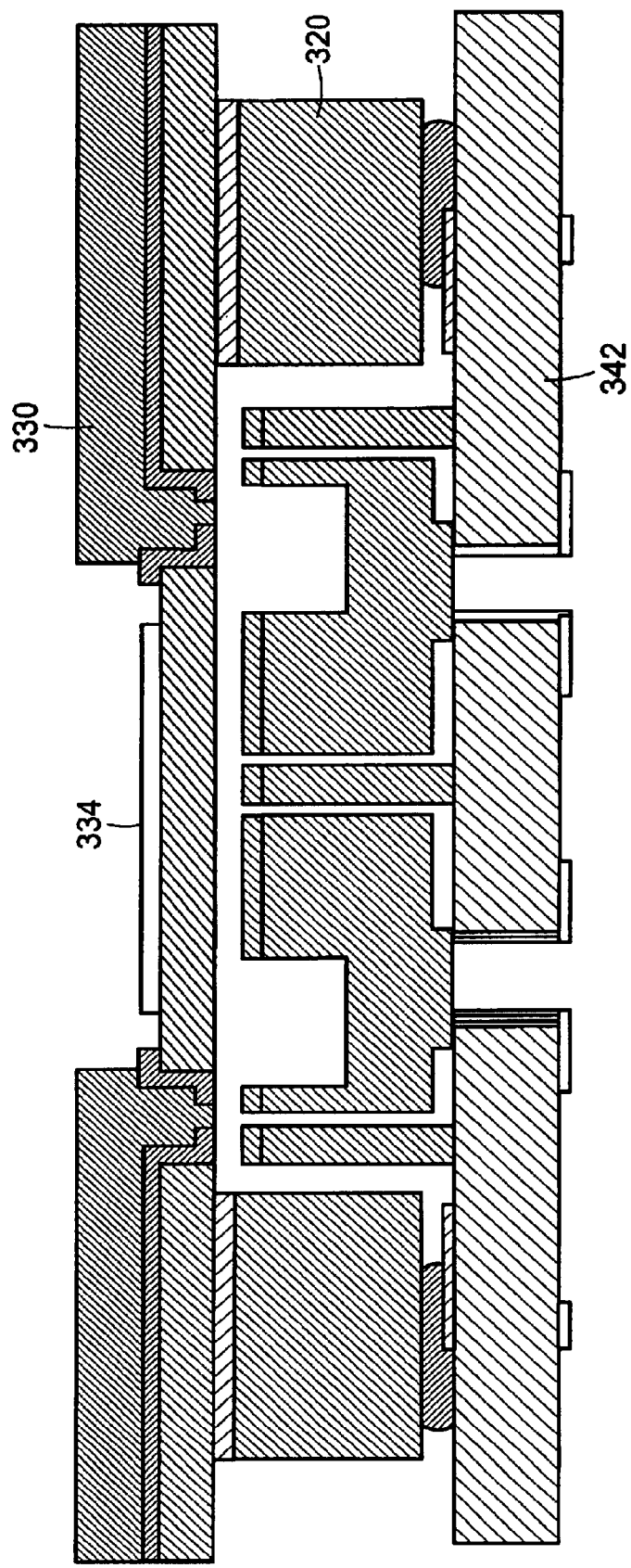
Figure 19M:
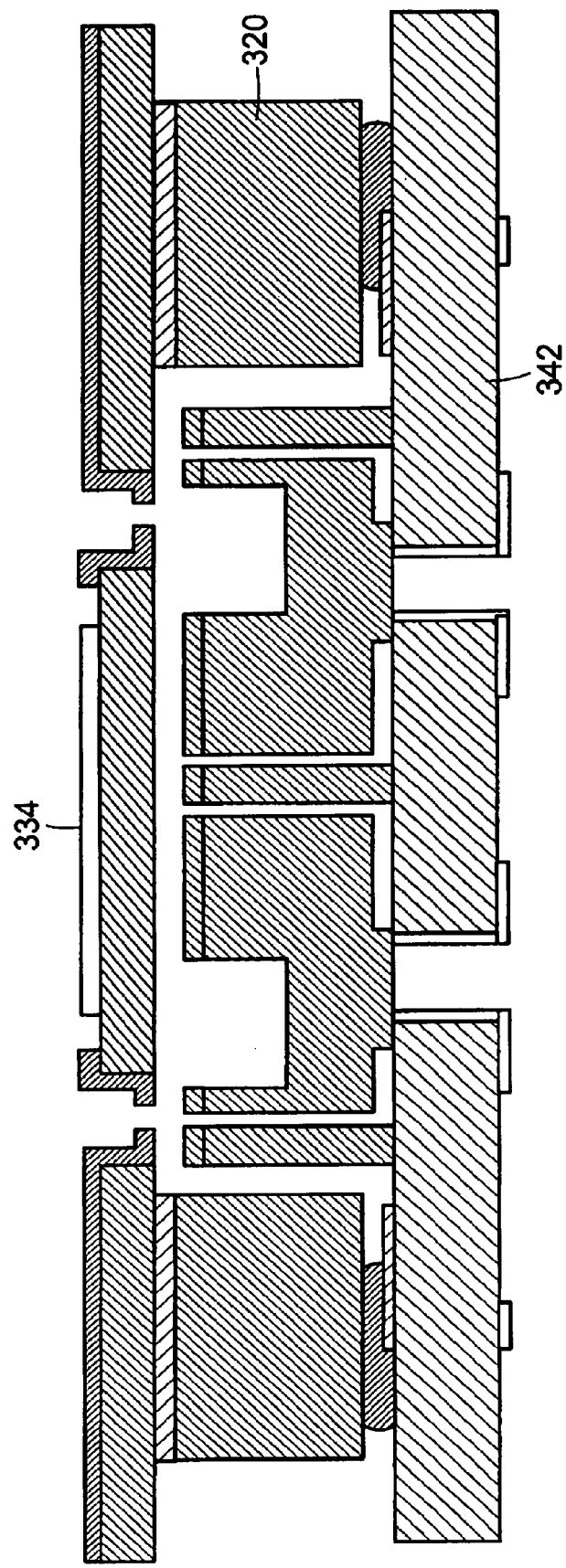

(1) Start with an SOI wafer 320 with oxide indicated at 321 as shown in FIG. 19A.
(2) Oxidize the wafer 320 as indicated by 323 (with a thickness of about 1 um) shown in FIG. 19B.
(3) Pattern oxide 322 on the topside of the wafer 320 as shown in FIG. 19C.
(4) Etch silicon to the BOX (Buried Oxide Layer) oxide in select areas 324 as shown in FIG. 19D.
(5) Deposit a thin layer of polysilicon 326 as shown in FIG. 19E. Also, remove oxide from the backside of the wafer. Implant with the same ion type (n or p type) as the original starting silicon wafer. The same type is preferably used in order to avoid the formation of a diode in the bulk silicon. Anneal the silicon wafer to relieve the stress of the polysilicon. The final released devices (both the springs, the frame, and the mirror) comprise polysilicon, and this step inhibits any warping of the structures, which could degrade mechanical performance and mirror flatness.
(6) Pattern and etch springs with the BOX oxide as an etch stop at 328 as shown in FIG. 19F. These springs are etched within the thinned area and are generally the thickness of the deposited polysilicon film. The polysilicon on top of the mirror is also etched away in this step using the oxide from step (2) as an etch stop.
(7) Spin and cure a polymer (e.g., polyimide) 330 on the topside of the wafer as shown in FIG. 19G. Deposit aluminum 332, which is then used as a hard mask for an O2 etch of the underlying polymer. Any material that can be etched and that is not attacked vigorously in O2 plasma can be used in this step. The polyimide is removed in the area where the gold will be patterned for the mirror. Strip oxide from mirror surface.
(8) Deposit a reflective metal 334 (e.g., Au) and etch away in certain areas leaving mirrors as shown in FIG. 19H. It is also preferable to deposit on top of the final reflective material a sacrificial material (e.g., Ti) that can be removed at the end of the process and protects the underlying material throughout.
(9) On the topside of the wafer spin thick protective resist 336 and Al 338 as shown in FIG. 19I. On the backside of the wafer pattern thick resist and etch silicon all the way to the front side oxide.
(10) Strip Al, photoresist, BOX oxide, and protective material (e.g., Ti) as shown in FIG. 19J.
(11) Deposit epoxy bumps 340 via screen-printing on selected areas of the backside of the silicon wafer as shown in FIG. 19K.
(12) Bond this silicon wafer 342 to the already-processed glass wafer (e.g., from FIG. 13F) as shown in FIG. 19L. This bonding can be done with a flip-chip machine. At this step, a pre-formed covering window (not shown) can be bonded.
(13) Release mirrors 334 by etching the polymer 330 on the topside of the wafer as shown in FIG. 19M preferably using a dry etch such as a gas plasma etch.

This fabrication process allows production of mirror arrays having a reduced mirror pitch. Conventional wet etching (KOH, TMAH or other type) can be used to define the space between the mirrors and the electrodes. However, this places large constraints on the minimum anchor size between the edge of one mirror and the edge of the next. This is because wet etching generally creates holes that become smaller as they are etched. Thus, in order to separate mirrors on one side of the wafer, the holes must be significantly larger on the other side of the wafer. In the preferred process, this wet etch is replaced with a DRIE (Deep Reactive Ion Etch) etch, which allows the mirrors to be placed much closer together, while still providing complete electrical isolation from pixel to pixel. However, the use of wet etching may still be possible depending on the etchant and the requirements for the size and spacing of the mirrors.

The polysilicon on top of the single crystal silicon forming the mirror support is stripped away if desired to further minimize the stress on the mirrors.

The coverage of the mirrors with a sacrificial layer until the end of the process is useful to keep this surface shiny and undamaged.

In accordance with another embodiment, a shadow masking technique can be utilized to apply gold to the backs of the mirrors. This technique is useful not only to minimize the radius of curvature ("ROC") of the mirror but also the change in this ROC with temperature. This process is illustrated in FIGS. 20A–20F as described below.

Figure 20F:
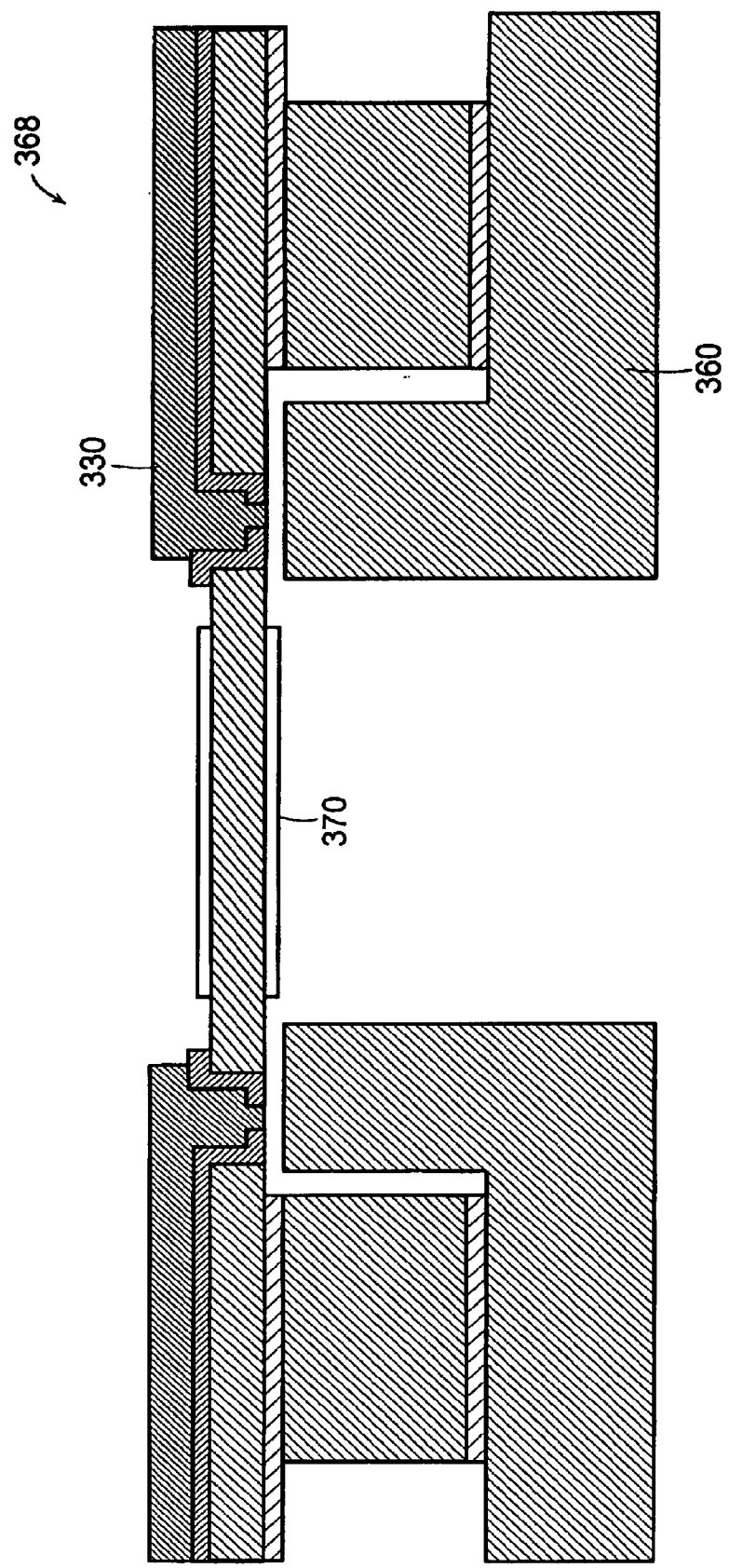

(1) Start with a double side polished silicon wafer 360 whose thickness is chosen based on the thickness of the SOI wafer used to make the mirrors as shown in FIG. 20A.
(2) Grow thermal oxide 362 (about 1.5 um thick) and strip off of the top side as shown in FIG. 20B. Deposit Al 364 on the top side of the wafer, pattern and etch it.
(3) Pattern the oxide 362 on the back of the wafer 360 with thick resist 366 and leave the resist on to aid in the etch mask for the DRIE from the back as shown in FIG. 20C.
(4) Etch topside of the wafer 360 to a pre-determined depth that is chosen based on design of the electrodes and the starting SOI wafer thickness as shown in FIG. 20D.
(5) Etch through the wafer 360 from the back to the Al etch stop 364 as shown in FIG. 20E. Strip the resist, aluminum and oxide.
(6) Affix the wafer 360 (tape, resist, etc.) to the device wafer 368 and evaporate Ti/Au from the back 370 with the same parameters as it was deposited from the front as shown in FIG. 20F.

The springs can be made of single crystal silicon either by starting with SOI wafers and thinning back, or by performing a selective epitaxial growth of silicon. This is advantageous as single crystal silicon has certain advantages over polycrystalline silicon (polysilicon) in terms of its mechanical properties.

The use of a sacrificial polymer 330 allows for safe release of the delicate structures without damage and also stabilizes the delicate silicon wafer during processing.

In accordance with another embodiment, a method of fabricating a MEMS mirror-gimbal structure is provided. The method includes (1) providing a silicon-on-insulator wafer having a device layer and a handle layer; (2) patterning the device layer to form flexure hinges of a gimbal mechanism; (3) performing selective epitaxial growth of silicon on the device layer to form a thickened silicon layer; and (4) patterning the thickened silicon layer to form a mirror and a gimbal frame of the gimbal mechanism.

Mirror Device Controllers

In accordance with another embodiment of the invention, individual mirror pixel devices in a mirror array are controlled using driver circuits such as ASIC (Application Specific Integrated Circuit) controllers. The ASIC controllers enable real time control of mirrors and allow the monitoring and precise adjusting of mirror positions. In particular, the controllers are able to control mirrors in the unstable pull-in phase of mirror movement. The dynamic range of each mirror can be increased, and the use of lower voltages to drive the mirrors is possible.

Figure 21:
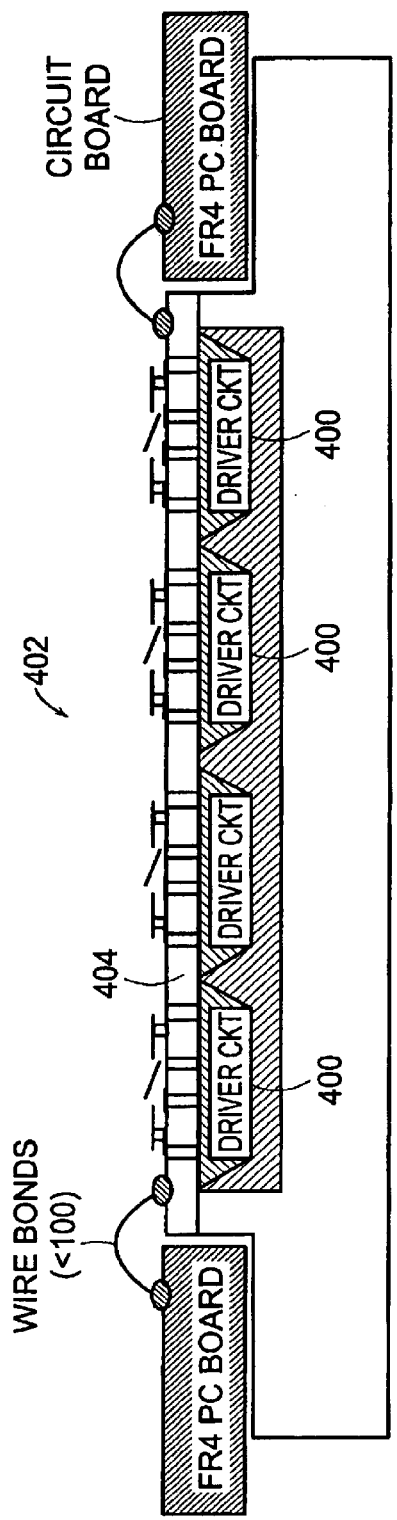
FIG. 21 is a cross-sectional schematic view of a MEMS array illustrating the integration of driver circuits in accordance with another embodiment of the invention.

As shown in FIG. 21, ASIC controllers 400 can be attached directly to the backside of a MEMS mirror array 402 using, e.g., flip-chip bonding on a glass wafer 404 supporting the mirror pixels. Other IC packaging and die-attachment methods are also possible including, e.g., wire bonding and/or tape-automated-bonding (TAB). The signals from the ASICs are re-routed through the wafer to bond pads that can be connected by various methods (e.g., bump bonding) to external circuitry.

A single ASIC controller can be used to control a plurality of mirror pixels. The use of the ASICs along with time-multiplexing and/or serial-digital input methods results in fewer connections to mirror packages (e.g., less than 100) as compared to the typical connection number of one connection per electrode (which can be, e.g., greater than 5000 for a mirror array).

Mirror Array Packaging

Figure 22:
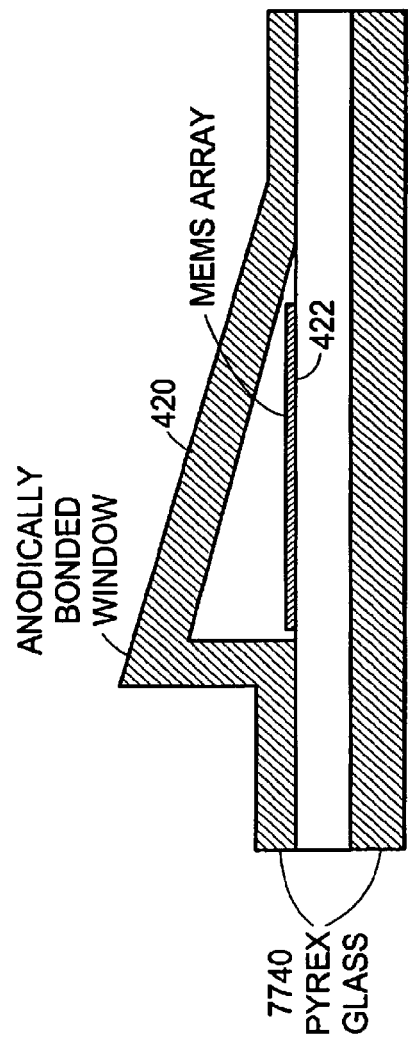

In accordance with another embodiment of the invention, a pre-formed, angled glass (preferably Pyrex) or other transparent material window 420 is used to hermetically seal the topside of a MEMS mirror array 422 as shown in FIG. 22. This window 420 can be anodically bonded to the interconnect wafer on which the mirror array is supported. An angled window is preferred over a flat window to avoid light reflected form the windows surface to interfere with other beams of light.

Figure 23A:
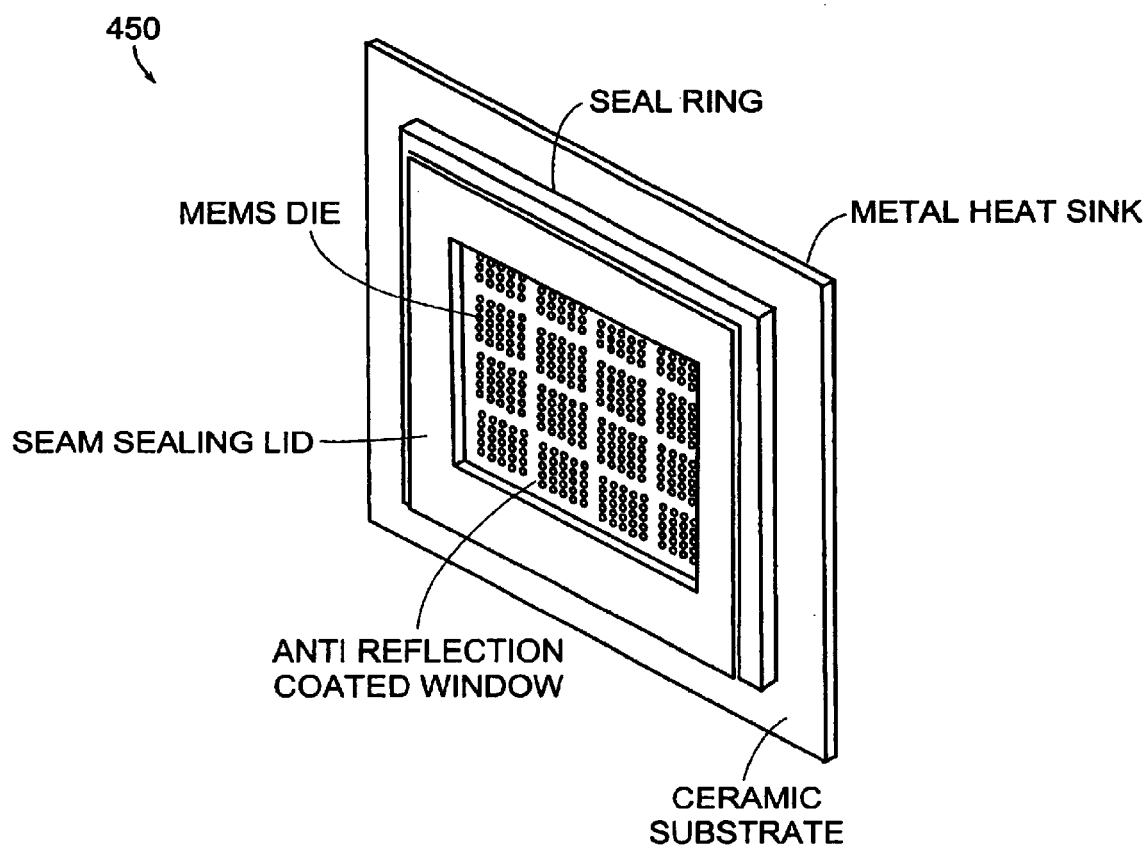
FIGS. 23A–23C are perspective, exploded and cross-sectional views, respectively, of a mirror array package in accordance with one embodiment of the invention.
Figure 23B:
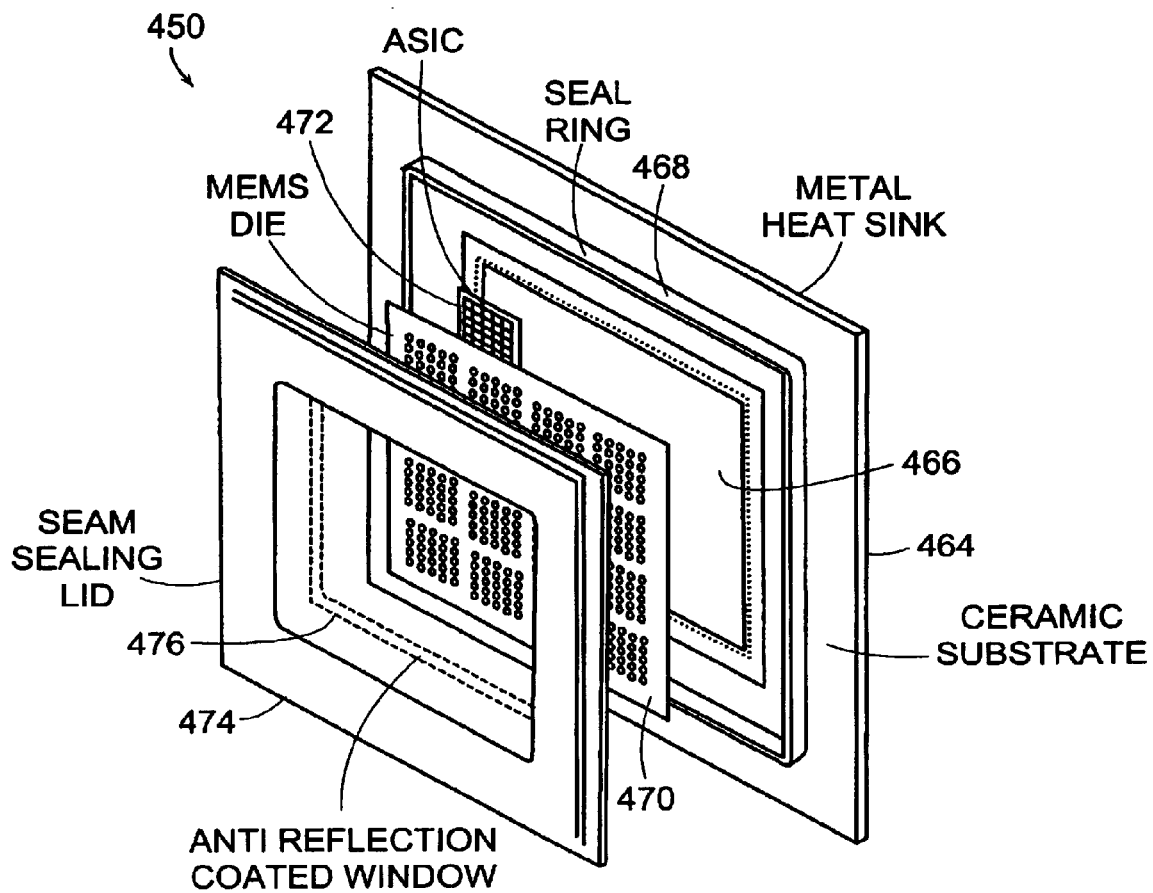
Figure 23C:
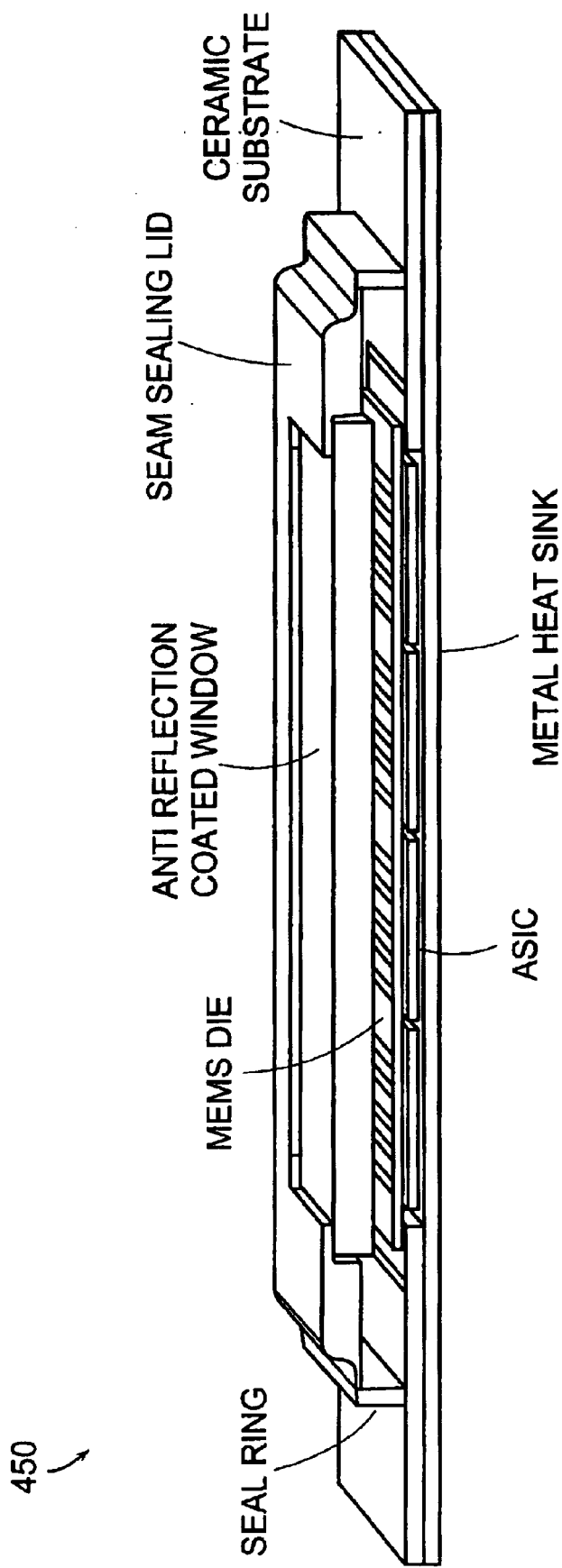
Figure 24:
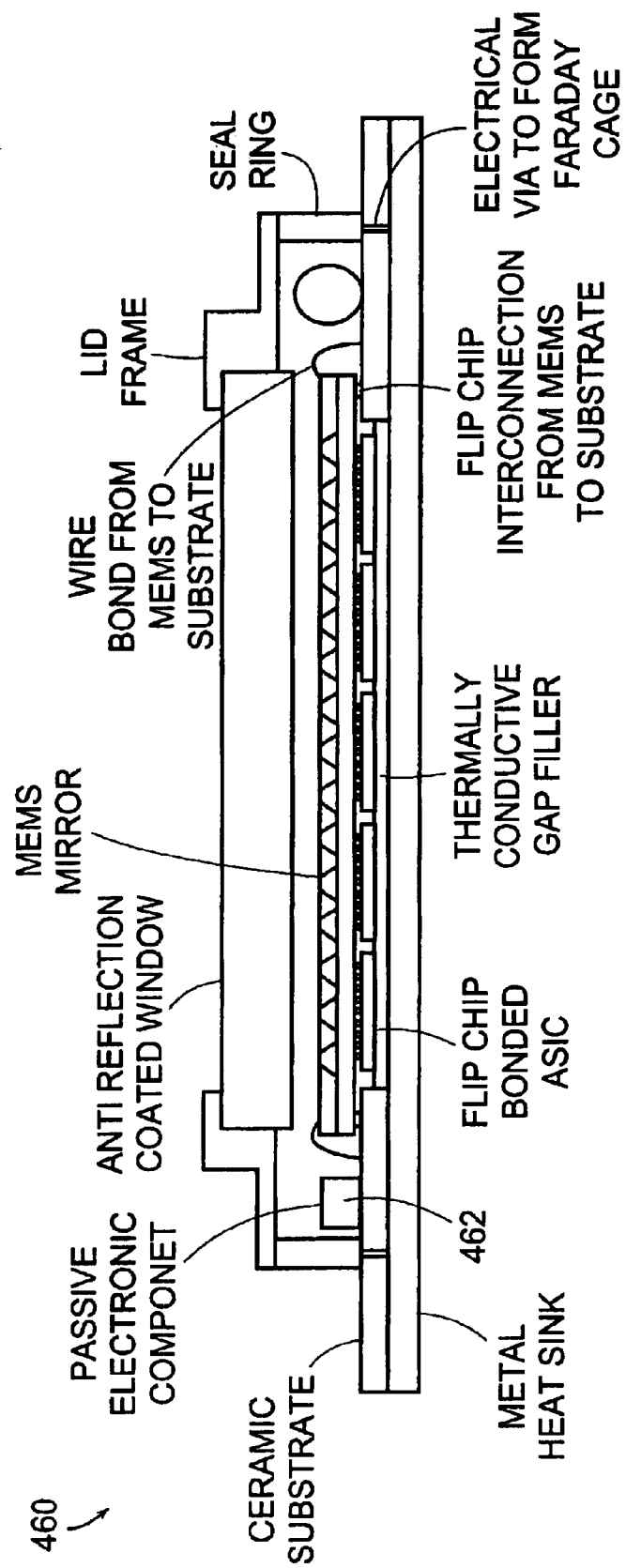
FIG. 24 is a cross-sectional view of a MEMS mirror array package in accordance with another embodiment of the invention.

Another embodiment of the invention is directed to the packaging and assembly of a large MEMS mirror array including the ASICs attached to the backside of the MEMS array as shown, e.g., in FIGS. 23A–23C and 24. FIGS. 23A–23C illustrate perspective, exploded and cross-sectional views, respectively, of a mirror array package 450. After the attachment of the ASICs, a MEMS mirror array is assembled into a package body. The package body provides environmental protection, heat dissipation, and electrical connection to the MEMS mirror array. As shown in FIG. 24, which shows another example of a MEMS package 460, the package body can also include passive electronic components 462. The package body includes a substrate or base 464 with a cavity 466, a seal ring 468, and conductors to provide electrical interconnection. The package body can be manufactured from various materials including ceramic, metal or some combination thereof. The body can comprise a flat metal base with a ceramic substrate laminated on top of it. The ceramic substrate can be a multi-layer structure that provides very high-density circuitry and can incorporate passive electronic components. In the preferred embodiment, the cavity 466 in the package body exposes the metal base. The metal base is a high thermal conductivity material with a coefficient of thermal expansion (CTE) matching the CTE of the ceramic.

The seal ring 468 can be made of a metal alloy providing a close CTE match to the ceramic. The seal ring can be brazed to the package body, surrounding the cavity 466. To provide shielding from electromagnetic interference (EMI) for the MEMS, the seal ring 468 can be electrically connected to a conductive and grounded plane underneath the cavity at several points. In the preferred package body, the metal base can serve as this conductive plane. To assemble the MEMS array to the package body, the MEMS array 470 is centered over the cavity 466, with the ASICs 472 on the back of the MEMS array pointed towards the cavity. The MEMS die is affixed to the package body along the edge of the cavity and electrical connection between the MEMS array and the package body is achieved by flip chip bonding, wire bonding or tape automated bonding, or a combination of these technologies. The gap between the back of the ASICs 472 and the bottom of the cavity is filled with a thermal conductor to create a path of low thermal resistance between the ASICs and the ambient air through the package body. This thermal path removes heat dissipated by the ASICs and, thus, controls the temperature of the ASIC's active surface.

A lid 474 is provided to hermetically seal the MEMS mirror array from the environment. The lid can be metal with a glass window 476 hermetically sealed to it. The glass window 476 can be sealed to the lid 474, e.g., brazing, soldering, or glass frit bonding. The lid 474 can be bonded to the seal ring 468 on the package body to form the hermetically sealed cavity. The bonding of the lid to the seal ring 468 is preferably done by seam welding, but could also be achieved by laser welding, brazing, or soldering. A near hermetic seal could be achieved by using an adhesive with very low moisture permeability and a bond line design optimized for low moisture penetration.

To minimize loss in the intensity of the light passing through the window 476, both surfaces of the window are preferably covered with an anti-reflection coating optimized for one or multiple wavelength ranges used in the application. To avoid the build-up of electrostatic charges on the window surface, the lid surface can be covered with a transparent, electrically conductive layer. Such a layer can be made of, among other materials, indium tin oxide (ITO). The thickness of this layer can be optimized to provide adequate electrical conductivity, while at the same time, not creating excessive optical loss. For the conductive layer to perform its function, it needs electrical connection to the metal lid. This electrical connection can be achieved by, e.g., using a conductive solder, braze, or glass frit to seal the window to the lid, an electrically conductive material dispensed between the glass and the lid after the sealing, or by conformal deposition of the conductive layer over the lid and the window after the sealing process. Once the lid is sealed to the seal frame and electrical connection between the seal frame and the lid is established, a Faraday cage is formed around the MEMS device, ASICs, and passive electronics components by the lid, the electrically conductive layer on the window, the seal ring, the conductive plane under the cavity, and the electrical connections between the seal ring and the conductive plane as shown in FIG. 24. This Faraday cage will protect the MEMS mirror array from electrostatic and electromagnetic interference.

To avoid optical interference between the light beams steered by the mirrors and light reflected from either surface of the window, the thickness and the distance between the window and the mirror surface can be optimized. Such optical interference occurs if light bouncing off from a mirror that is parallel to the window is reflected by the window and falls back onto another mirror that is also parallel to the window. The thickness of the window and the distance between the window and the MEMS mirror can be chosen in such a way that light bouncing off from a mirror that is parallel to the window is reflected by the window will not fall onto another mirror. Another way to avoid such interference is by angling the window in such a way that it will not be parallel to any mirror at any time.

Having described various preferred embodiments of the present invention, it should be apparent that modifications can be made without departing from the spirit and scope of the invention.

What is claimed is:

1. A MEMS mirror device, comprising:
   a mirror;
   a gimbal structure for movably supporting the mirror, the gimbal structure including two pairs of flexure hinges, each pair defining an axis about which said mirror can be rotated, at least some of said flexure hinges having a folded configuration in a cross-section taken generally perpendicular to a respective axis to increase torsional compliance about said respective axis and to decrease compliance in other directions; and
   a mechanism for actuating the mirror.

2. The MEMS mirror device of claim 1 wherein each flexure hinge has a generally U-shaped cross-sectional configuration.

3. The MEMS mirror device of claim 1 wherein each flexure hinge has a generally V-shaped cross-sectional configuration.

4. The MEMS mirror device of claim 1 wherein each flexure hinge has multiple folds.

5. The MEMS mirror device of claim 1 wherein said pairs of flexure hinges comprise an inner pair connecting the mirror to an inner gimbal frame, and an outer pair connecting the inner gimbal frame to an outer gimbal frame, and wherein said outer pair have lower torsional compliance compared to the inner pair.

6. The MEMS mirror device of claim 1 wherein each flexure hinge comprises a plurality of springs, and wherein said springs are arranged in a folded configuration in a top view thereof.

7. A MEMS mirror device, comprising:
   a mirror;
   a gimbal structure for movably supporting the mirror, the gimbal structure including two pairs of flexure hinges, each pair defining an axis about which said mirror can be rotated, said flexure hinges each comprising multiple springs in a folded configuration, each spring also having a folded configuration in a cross-section taken generally perpendicular to a respective axis to increase torsional compliance about said respective axis and to decrease torsional compliance in other directions; and
   a mechanism for actuating the mirror.

8. The MEMS mirror device of claim 7 wherein each spring has a generally U-shaped cross-sectional configuration.

9. The MEMS mirror device of claim 7 wherein each spring has a generally V-shaped cross-sectional configuration.

10. The MEMS mirror device of claim 7 wherein each spring has multiple folds.

11. The MEMS mirror device of claim 7 wherein said pairs of flexure hinges comprise an inner pair connecting the mirror to an inner gimbal frame, and an outer pair connecting the inner gimbal frame to an outer gimbal frame, and wherein said outer pair have lower torsional compliance compared to the inner pair.

12. A MEMS mirror device, comprising:
    a mirror;
    a support structure for movably supporting the mirror, the support structure including a movable portion with a plurality of holes distributed on said movable portion to reduce weight thereof and provide a lower moment of inertia; and
    a mechanism for actuating the mirror.

13. The MEMS mirror device of claim 12, wherein said holes are through-holes to affect air damping of the device.

14. The MEMS mirror device of claim 12, wherein said holes are recesses extending only partly through said movable portion of said support structure.

15. The MEMS mirror device of claim 12, wherein said holes are thinned out areas etched in the structure.

16. The MEMS mirror device of claim 12 wherein said support structure is a gimbal mechanism.

17. The MEMS mirror device of claim 16, wherein said gimbal mechanism comprises an inner and outer frames, and wherein said movable portion comprises said inner frame.

18. The MEMS mirror device of claim 12, wherein said holes are arranged in a honeycomb lattice-like configuration.

19. The MEMS mirror device of claim 12, wherein said mechanism comprises at least one electrode for electrostatically actuating said mirror.

20. A gimbal mechanism for movably supporting a structure, the gimbal mechanism including two pairs of flexure hinges, each pair defining an axis about which said structure can be rotated, said flexure hinges each having a folded configuration in a cross-section taken generally perpendicular to a respective axis to increase torsional compliance about said respective axis and to decrease compliance in other directions.

21. The gimbal mechanism of claim 20 wherein each flexure hinge has a generally U-shaped cross-sectional configuration.

22. The gimbal mechanism of claim 20 wherein each flexure hinge has a generally V-shaped cross-sectional configuration.

23. The gimbal mechanism of claim 20 wherein each flexure hinge has multiple folds.

24. The gimbal mechanism of claim 20 wherein said pairs of flexure hinges comprise an inner pair connecting the structure to an inner gimbal frame, and an outer pair connecting the inner gimbal frame to an outer gimbal frame, and wherein said outer pair have lower torsional compliance compare to the inner pair.

25. The gimbal mechanism of claim 20 wherein each flexure hinge comprises a plurality of springs, and wherein said springs are arranged in a folded configuration in a top view thereof.

26. A gimbal mechanism for movably supporting a structure, the gimbal mechanism including two pairs of flexure hinges, each pair defining an axis about which said structure can be rotated, said flexure hinges each comprising multiple springs in a folded configuration, each spring also having a folded configuration in a cross-section taken generally perpendicular to a respective axis to increase torsional compliance about said respective axis and to decrease torsional compliance in other directions.

27. The gimbal mechanism of claim 26 wherein each spring has a generally U-shaped cross-sectional configuration.

28. The gimbal mechanism of claim 26 wherein each spring has a generally V-shaped cross-sectional configuration.

29. The gimbal mechanism of claim 26 wherein each spring has multiple folds.

30. The gimbal mechanism of claim 26 wherein said pairs of flexure hinges comprise an inner pair connecting the structure to an inner gimbal frame, and an outer pair connecting the inner gimbal frame to an outer gimbal frame, and wherein said outer pair have lower torsional compliance compared to the inner pair.

31. A MEMS mirror device, comprising:

a mirror;

a gimbal structure for rotatably supporting the mirror, said mirror being movable along a given path;

two pairs of electrodes for electrostatically actuating the mirror about said axes, each electrode having at least a portion thereof positioned about the periphery of said mirror and outside of said path; and a bump stop located between said electrodes to restrict movement of said mirror beyond a given position.

* * * * *